(12) United States Patent
Shih et al.

(10) Patent No.: US 12,513,815 B2
(45) Date of Patent: Dec. 30, 2025

(54) ELECTRONIC DEVICE AND METHOD OF MANUFACTURING THE SAME

(71) Applicant: Advanced Semiconductor Engineering, Inc., Kaohsiung (TW)

(72) Inventors: Hsu-Chiang Shih, Kaohsiung (TW);
Cheng-Yuan Kung, Kaohsiung (TW);
Hung-Yi Lin, Kaohsiung (TW);
Meng-Wei Hsieh, Kaohsiung (TW);
Chien-Mei Huang, Kaohsiung (TW);
I-Ting Lin, Kaohsiung (TW);
Sheng-Wen Yang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 362 days.

(21) Appl. No.: 18/086,579

(22) Filed: Dec. 21, 2022

(65) Prior Publication Data
US 2024/0215151 A1    Jun. 27, 2024

(51) Int. Cl.
*H05K 1/02* (2006.01)
*H05K 1/11* (2006.01)

(52) U.S. Cl.
CPC ......... *H05K 1/0271* (2013.01); *H05K 1/0298* (2013.01); *H05K 1/115* (2013.01); *H05K 2201/09827* (2013.01)

(58) Field of Classification Search
CPC .... H05K 1/0271; H05K 1/0298; H05K 1/115; H05K 2201/09827
USPC .......................................................... 361/760
See application file for complete search history.

(56) References Cited

U.S. PATENT DOCUMENTS

| | | |
|---|---|---|
| 10,141,252 B2 | 11/2018 | Sung et al. |
| 2023/0307330 A1* | 9/2023 | Chen .................... H01L 23/5389 |
| 2024/0079337 A1* | 3/2024 | Marin ................. H01L 23/5386 |

FOREIGN PATENT DOCUMENTS

EP    2312922 B1    9/2012

* cited by examiner

*Primary Examiner* — Timothy J Thompson
(74) *Attorney, Agent, or Firm* — FOLEY & LARDNER LLP

(57) ABSTRACT

The present disclosure provides an electronic device and a method of manufacturing the same. The electronic device includes a first redistribution structure and a first encapsulant. The first encapsulant supports the first redistribution structure and is configured to function as a first reinforcement to provide a second redistribution structure. The redistribution structure has a plurality of conductive layers disposed over the first redistribution structure.

20 Claims, 28 Drawing Sheets

ELECTRONIC DEVICE AND METHOD OF MANUFACTURING THE SAME

BACKGROUND

1. Field of the Disclosure

The present disclosure generally relates to an electronic device, in particular to an electronic device with a reinforcement configured to reduce warpage of the electronic device.

2. Description of the Related Art

To meet the required electrical properties (e.g., low resistance and/or inductance) of an electronic device including different components (e.g., application-specific integrated circuit and/or power management integrated circuit), a redistribution structure including multiple dielectric layers (e.g., six dielectric layers or more) is utilized. However, such redistribution structure may generate significant warpage due to mismatch of coefficient of thermal expansion (CTE) among different materials, which makes the intermediate structure of the electronic device unable to be placed in manufacturing equipment

SUMMARY

In some embodiments, an electronic device includes a first redistribution structure and a first encapsulant. The first encapsulant supports the first redistribution structure and is configured to function as a first reinforcement to provide a second redistribution structure. The redistribution structure has a plurality of conductive layers disposed over the first redistribution structure.

In some embodiments, an electronic device includes a redistribution structure, a first electronic component, a first reinforcement, and a second reinforcement. The first electronic component is disposed over the redistribution structure. The first reinforcement is disposed under the redistribution structure. The second reinforcement is disposed between the redistribution structure and the first electronic component.

In some embodiments, a method of manufacturing an electronic device includes: providing a structure comprising a first redistribution structure and a first reinforcement supporting the first redistribution structure; forming a second redistribution structure over the first redistribution structure; and disposing a first electronic component over the second redistribution structure.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1A:
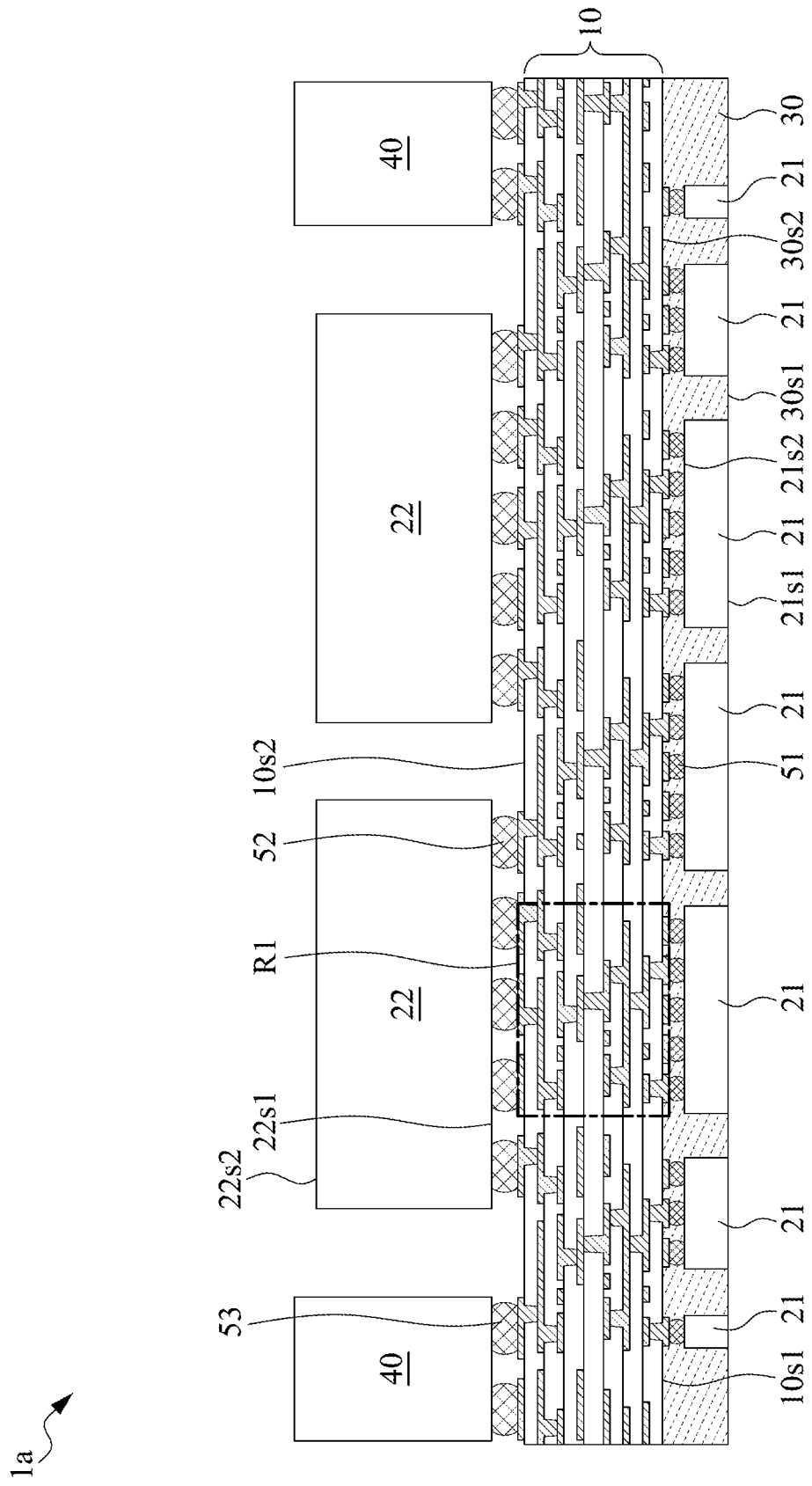
FIG. 1A is a cross-sectional view of an electronic device, in accordance with an embodiment of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1A is a cross-sectional view of an electronic device 1a, in accordance with an embodiment of the present disclosure. In some embodiments, the electronic device 1a may include a redistribution structure 10, a plurality of electronic components 21, a plurality of electronic components 22, a reinforcement 30, and a plurality of connectors 40.

The redistribution structure 10 may be configured to electrically connect the electronic components 21, 22, and/or connector 40. The redistribution structure 10 may be formed of, for example, a printed circuit board, such as a paper-based copper foil laminate, a composite copper foil laminate, or a polymer-impregnated glass-fiber-based copper foil laminate. The redistribution structure 10 may include multiple dielectric layers, conductive layers and conductive vias, which will be further described in FIG. 1B and FIG. 1C. The redistribution structure 10 may have a surface 10s1 (or a lower surface) and a surface 10s2 (or an upper surface) opposite to the surface 10s1.

The electronic component 21 may be disposed on or over the surface 10s1 of the redistribution structure 10. In some embodiments, the electronic component 21 may be configured to transmit, for example, a data signal. The electronic component 21 may include a chip or a die including a semiconductor substrate, one or more integrated circuit (IC) devices and one or more overlying interconnection structures therein. The IC devices may include active devices (e.g., transistors) and/or passive devices (e.g., resistors, capacitors, inductors, or a combination thereof). In some embodiments, the electronic component 21 may include an application-specific IC (ASIC), a high bandwidth memory (HBM), a central processing unit (CPU), a microprocessor unit (MPU), a graphics processing unit (GPU), a microcontroller unit (MCU), a field-programmable gate array (FPGA), or other IC devices. The electronic component 21 may include a surface 21s1 and a surface 21s2 opposite to the surface 21s1. The surface 21s1 of the electronic component 21 may face away from the redistribution structure 10 and serve as a backside surface. The surface 21s2 of the electronic component 21 may face the surface 10s1 of the redistribution structure 10 and serve as an active surface.

The electronic component 22 may be disposed on or over the surface 10s2 of the redistribution structure 10. The electronic component 22 may be electrically or signally connected to the electronic component 21 through the redistribution structure 10. In some embodiments, the electronic component 22 may be configured to transmit, for example, a power signal. The electronic component 22 may include one or more chips or dies. In some embodiments, the electronic component 22 may include a power management die (e.g., power management integrated circuit (PMIC) die) or other IC devices. In some embodiments, the electronic component 22 may include two or more dies, which may be connected by an interposer(s), and the electronic component 22 may further include an encapsulant encapsulating these components. The electronic component 22 may include a surface 22s1 (or a lower surface) and a surface 22s2 (or an upper surface) opposite to the surface 22s1. The surface 22s1 of the electronic component 22 may face the surface 10s2 of the redistribution structure 10 and serve as an active surface. The surface 22s2 of the electronic component 22 may face away from the redistribution structure 10 and serve as a backside surface.

In some embodiments, the reinforcement 30 may be disposed on or over the surface 10s1 of the redistribution structure 10. In some embodiments, the reinforcement 30 may be configured to reduce the warpage of the electronic device 1a. In some embodiments, the reinforcement 30 may serve as a carrier during processes of manufacturing the electronic device 1a, which thereby reduces warpage of an intermediate structure of the electronic device 1a. In some embodiments, the reinforcement 30 may configured to provide or facilitate the formation of a portion of the redistribution structure, which will be discussed in detail in FIG. 4 to FIG. 9. In some embodiments, the reinforcement 30 may encapsulate the electronic components 21. In some embodiments, the reinforcement 30 may include an encapsulant (or a molding layer). In some embodiments, the reinforcement 30 may be made of molding material that may include, for example, a Novolac-based resin, an epoxy-based resin, a silicone-based resin, or other another suitable encapsulant. Suitable fillers may also be included, such as powdered $SiO_2$. The reinforcement 30 may have a surface 30s1 (or a lower surface) and a surface 30s2 (or an upper surface) opposite to the surface 30s1. In some embodiments, the surface 30s1 of the reinforcement 30 may be aligned with the surface 21s1 of the electronic component 21.

The connector 40 may be disposed on or over the surface 10s2 of the redistribution structure 10. In some embodiments, the connector 40 may be configured to electrically or signally connect the electronic device 1a to an external device (not shown). In some embodiments, the connector 40 may be electrically or signally connected to the electronic component 21 through the redistribution structure 10. In some embodiments, the connector 40 may be electrically or signally connected to the electronic component 22 through the redistribution structure 10. In some embodiments, the connectors 40 may surround the electronic components 22.

In some embodiments, the electronic device 1a may further include conductive elements 51, 52, and 53 (or solder elements). The conductive elements 51, 52, and/or 53 may include one or more materials, such as alloys of gold and tin solder or alloys of silver and tin solder.

The conductive element 51 may be disposed on or over the surface 10s1 of the redistribution structure 10. The electronic component 21 may be electrically connected to the redistribution structure 10 through the conductive element 51. The conductive element 52 may be disposed on or over the surface 10s2 of the redistribution structure 10. The electronic component 22 may be electrically connected to the redistribution structure 10 through the conductive element 52. The conductive element 53 may be disposed on or over the surface 10s2 of the redistribution structure 10. The connector 40 may be electrically connected to the redistribution structure 10 through the conductive element 53. In some embodiments, the dimension (e.g., diameter) of the conductive element 51 may be less than that of the conductive element 52 (or 53). In some embodiments, the pitch of the conductive element 51 may be different from that of the conductive element 52 (or 53) due to different input/output densities. In some embodiments, the pitch of the conductive elements 51 may be less than that of the conductive elements 52 (or 53).

Figure 1B:
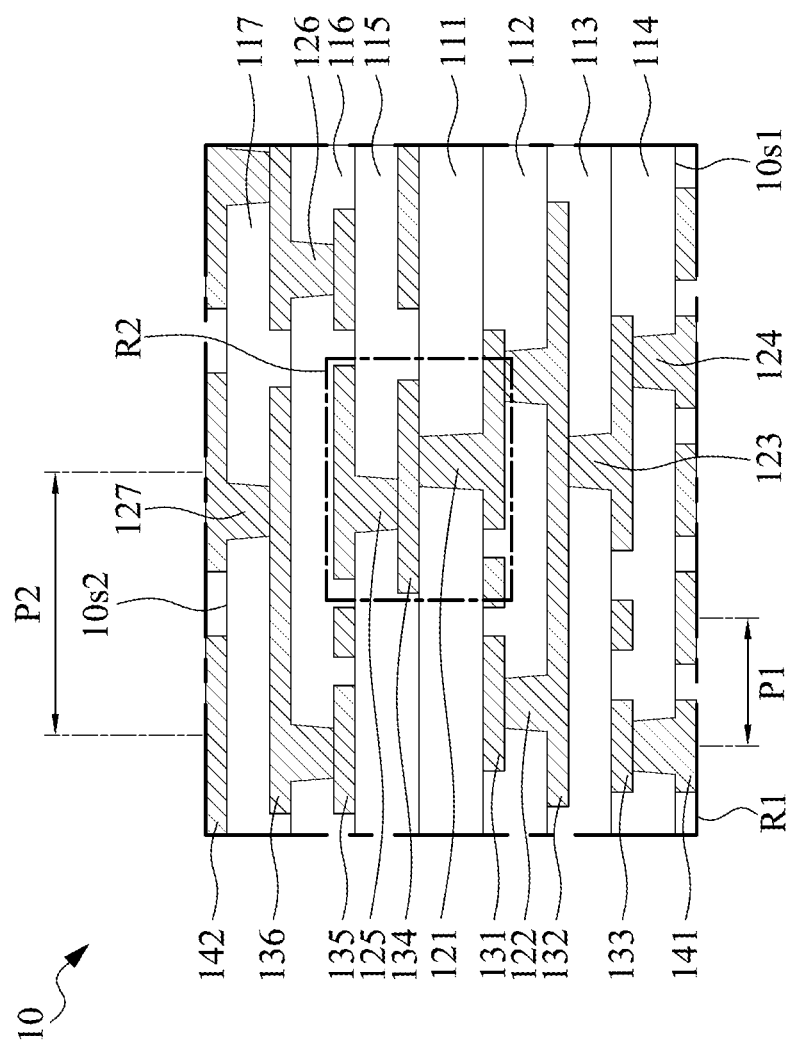
FIG. 1B is a partial enlarged view of the electronic device as shown in FIG. 1A, in accordance with an embodiment of the present disclosure.

FIG. 1B is a partial enlarged view of region R1 as shown in FIG. 1A, in accordance with an embodiment of the present disclosure.

In some embodiments, the redistribution structure 10 may include dielectric layers 111, 112, 113, 114, 115, 116, and 117. Each of the dielectric layers 111, 112, 113, 114, 115, 116, and/or 117 may include polyimide (PI), polybenzoxazole (PBO), polypropylene (PP), or other suitable materials. The dielectric layer 114 may be the bottommost layer of the redistribution structure 10. The lower surface (not annotated) of the dielectric layer 114 may serve as the surface 10s1 of the redistribution structure 10. The dielectric layer 117 may be the topmost layer of the redistribution structure 10. The upper surface (not annotated) of the dielectric layer 117 may serve as the surface 10s2 of the redistribution structure 10. The dielectric layer 113 may be disposed on or over the dielectric layer 114. The dielectric layer 112 may be disposed on or over the dielectric layer 113. The dielectric layer 111 may be disposed on or over the dielectric layer 112. The dielectric layer 115 may be disposed on or over the dielectric layer 111. The dielectric layer 116 may be disposed on or over the dielectric layer 115. The dielectric layer 117 may be disposed on or over the dielectric layer 116. Although FIG. 1B illustrates that the redistribution structure 10 includes seven dielectric layers, it should be noted that the redistribution structure 10 may include six or more dielectric layers, such as six dielectric layers, eight dielectric layers, nine dielectric layers, or more.

In some embodiments, the redistribution structure 10 may include conductive vias 121, 122, 123, 124, 125, 126, and 127. The conductive via 121 may be at least partially disposed or embedded within the dielectric layer 111. The conductive via 122 may be at least partially disposed or embedded within the dielectric layer 112. The conductive via 123 may be at least partially disposed or embedded within the dielectric layer 113. The conductive via 124 may be at least partially disposed or embedded within the dielectric layer 114. The conductive via 125 may be at least partially disposed or embedded within the dielectric layer 115. The conductive via 126 may be at least partially disposed or embedded within the dielectric layer 116. The conductive via 127 may be at least partially disposed or embedded within the dielectric layer 117. In some embodiments, the conductive vias 121, 122, 123, and/or 124 may be tapered toward the surface 10s2 of the redistribution structure 10. In some embodiments, the conductive vias 125, 126, and/or 127 may be tapered toward the surface 10s1 of the redistribution structure 10. The reverse profiles of the conductive vias 121, 122, 123, 124, 125, 126, and/or 127 may assist in reducing the warpage of the redistribution structure 10 during manufacturing processes. The conductive vias 121, 122, 123, 124, 125, 126, and/or 127 may include copper (Cu), aluminum (Al), gold (Au), or other suitable materials.

In some embodiments, the redistribution structure 10 may include conductive layers 131, 132, 133, 134, 135, and 136. The conductive layer 131 may be disposed on or over the lower surface (not annotated) of the dielectric layer 111. The conductive layer 132 may be disposed on or over the lower surface (not annotated) of the dielectric layer 112. The conductive layer 133 may be disposed on or over the lower surface (not annotated) of the dielectric layer 113. The conductive layer 134 may be disposed on or over the upper surface (not annotated) of the dielectric layer 111. The conductive layer 135 may be disposed on or over the upper surface (not annotated) of the dielectric layer 115. The conductive layer 136 may be disposed on or over the upper surface (not annotated) of the dielectric layer 116.

In some embodiments, the redistribution structure 10 may include conductive pads 141 and 142. The conductive pads 141 may be disposed on or over the surface 10s1 of the redistribution structure 10. Each of the conductive pads 141 may be connected to the conductive elements 51 as shown in FIG. 1A. The conductive pads 142 may be disposed on or over the surface 10s2 of the redistribution structure 10. Each of the conductive pads 142 may be connected to the conductive elements 52 (or 53) as shown in FIG. 1A. In some embodiments, a pitch P1 of the conductive pads 141 may be less than a pitch P2 of the conductive pads 142.

Figure 1C:
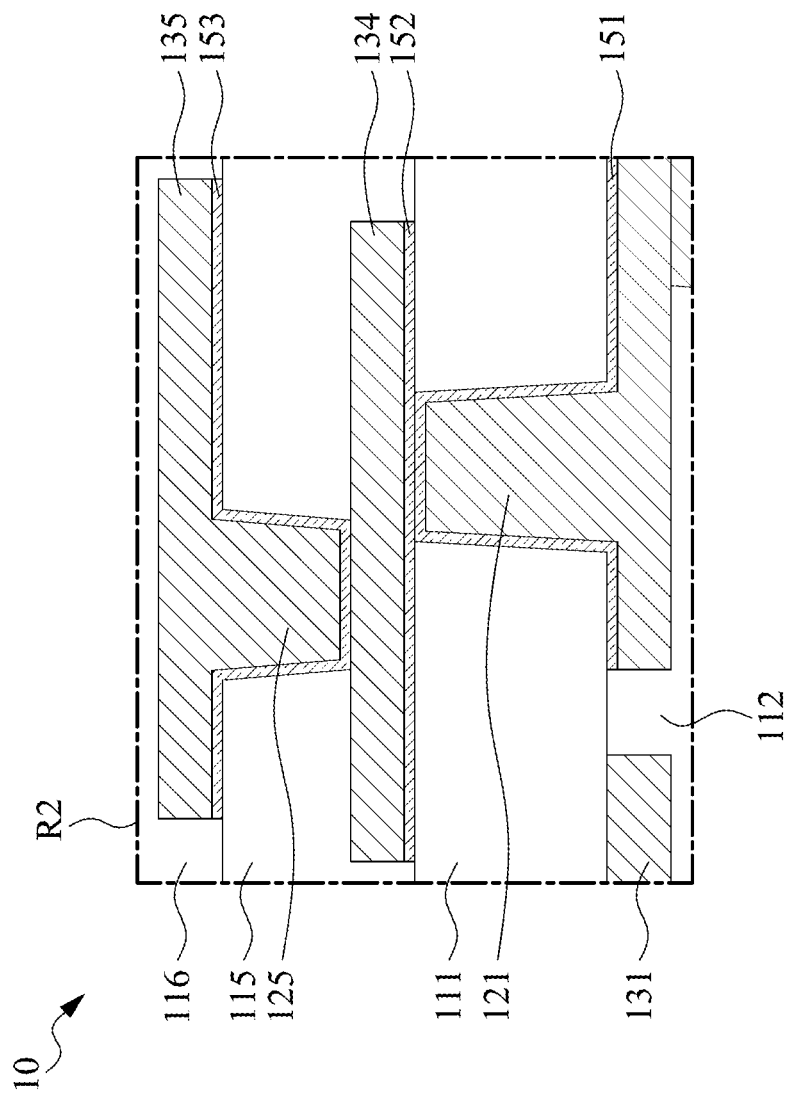
FIG. 1C is a partial enlarged view of the electronic device as shown in FIG. 1B, in accordance with an embodiment of the present disclosure.

FIG. 1C is a partial enlarged view of region R2 as shown in FIG. 1B, in accordance with an embodiment of the present disclosure.

In some embodiments, the redistribution structure 10 may further include seed layers 151, 152, and 153. The seed layer 151 may be conformally disposed on a lower surface and a recess (not annotated) of the dielectric layer 111. The seed layer 152 may abut or be in contact with the seed layer 151. The seed layer 152 may be disposed on or over an upper surface (not annotated) of the dielectric layer 111. The seed layer 153 may be conformally disposed on an upper surface and a recess (not annotated) of the dielectric layer 115. The seed layers 151, 152, and/or 153 may be formed of, for example, copper (Cu), tin (Sn), stainless steel, another metal or metal alloy, or a combination thereof.

When a redistribution structure has six or more dielectric layers and conductive layers (e.g., seven dielectric layers and six conductive layers), the intermediate structure of an electronic device may have a relatively significant warpage (e.g., greater than 2 mm) due to mismatch of coefficient of thermal expansion (CTE) between the carrier and the dielectric layers, which makes the intermediate structure unable to be placed in manufacturing equipment. In this embodiment, the redistribution structure is produced by two operations involving reversing the intermediate structure, and thus conductive vias with reverse profiles are formed. In this condition, the warpage of the intermediate structure (or final structure) can be reduced, which allows the intermediate structure to be placed in manufacturing equipment. Further, in this embodiment, electronic components, with different densities of input/output terminals, can be disposed on two opposite surfaces of the redistribution structure, which facilitates the integration of multiple functional IC devices.

Figure 2:
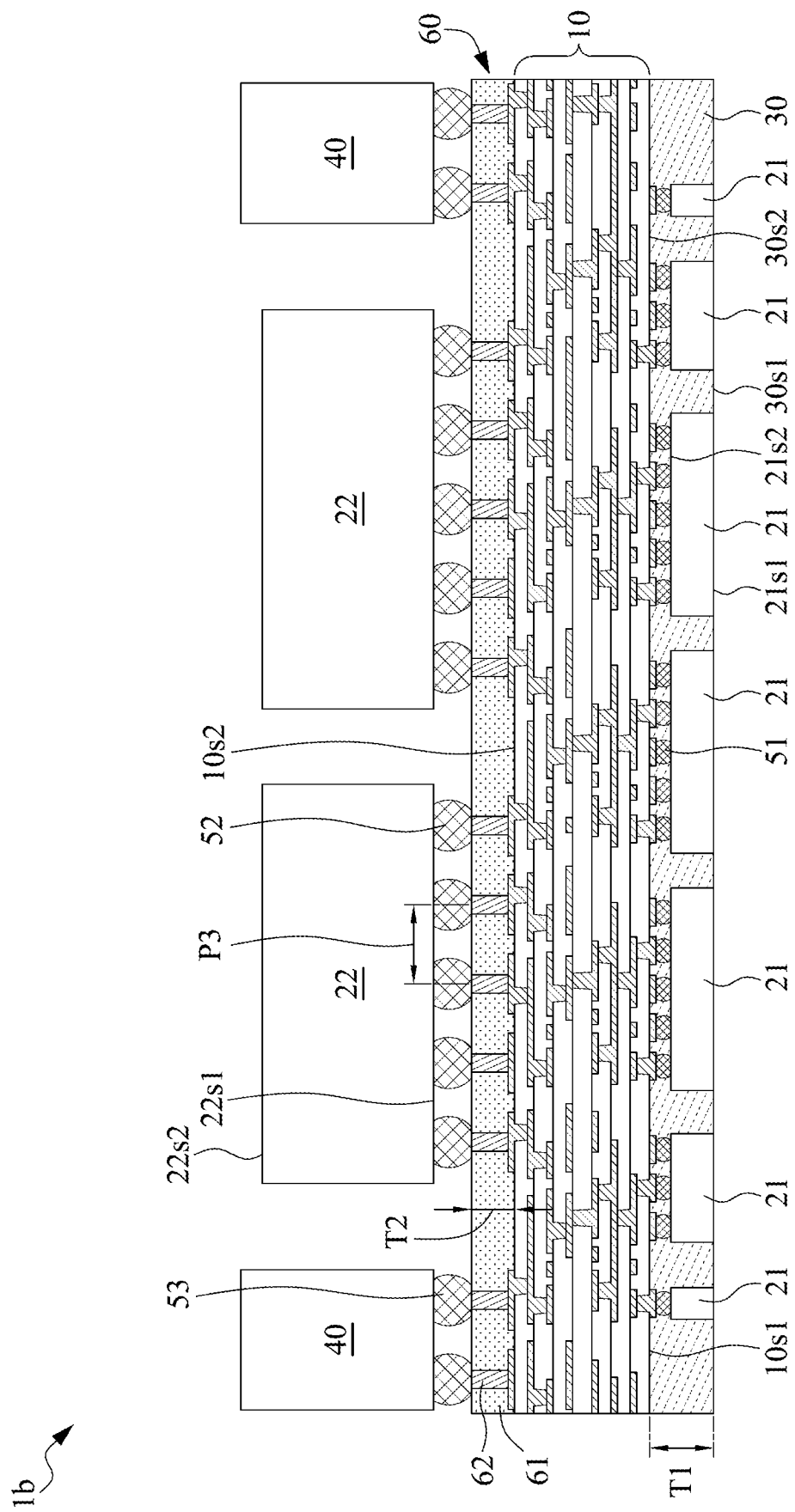
FIG. 2 is a cross-sectional view of an electronic device, in accordance with an embodiment of the present disclosure.

FIG. 2 is a cross-sectional view of an electronic device 1b, in accordance with an embodiment of the present disclosure. The electronic device 1b is similar to the electronic device 1a as shown in FIG. 1A, and the differences therebetween are described below.

In some embodiments, the electronic device 1b may include a reinforcement 60. In some embodiments, the reinforcement 60 may be disposed on or over the surface 10s2 of the redistribution structure 10. In some embodiments, the reinforcement 60 may be disposed between the redistribution structure 10 and the electronic component 22. In some embodiments, the reinforcement 60 may be disposed between the redistribution structure 10 and the connector 40. In some embodiments, the reinforcement 60 may be configured to reduce the warpage of the electronic device 1b. In some embodiments, the reinforcements 30 and 60 may be collectively configured to reduce the warpage of the electronic device 1b. In some embodiments, the reinforcement 60 may be configured to electrically connect the electronic component 22 and the redistribution structure 10. In some embodiments, the reinforcement 60 may be configured to electrically connect the connector 40 and the redistribution structure 10. The reinforcement 30 may have a thickness T1. The reinforcement 60 may have a thickness T2. In some embodiments, the thickness T2 of the reinforcement 60 may be different from the thickness T1 of the reinforcement 30. In some embodiments, the thickness T2 of the reinforcement 60 may be greater than the thickness T1 of the reinforcement 30. In some embodiments, the reinforcement 60 may include an encapsulant 61 and interconnections 62.

In some embodiments, the encapsulant 61 (or a molding layer) may be disposed on or over the surface 10s2 of the redistribution structure 10. In some embodiments, the encapsulant 61 may be disposed between the redistribution structure 10 and the conductive element 52. In some embodiments, the encapsulant 61 may be disposed between the redistribution structure 10 and the conductive element 53. The encapsulant 61 may cover the pads (e.g., the conductive pads 142 as shown in FIG. 1B) of the redistribution structure 10. In some embodiments, the encapsulant 61 may encapsulate the interconnections 62. In some embodiments, the encapsulant 61 may be made of molding material that may include, for example, a Novolac-based resin, an epoxy-based resin, a silicone-based resin, or other another suitable encapsulant. Suitable fillers may also be included, such as powdered $SiO_2$. In some embodiments, the thickness of the encapsulant 61 may be identical to the thickness T2 of the reinforcement 60. In some embodiments, the encapsulant 61 may include a material the same as that of the reinforcement 30.

In some embodiments, the interconnection 62 may be disposed on or over the surface 10s2 of the redistribution structure 10. In some embodiments, the interconnection 62 may penetrate or pass through the encapsulant 61. In some embodiments, each of the interconnections 62 may be connected to a corresponding one of the pads (e.g., the conductive pads 142 as shown in FIG. 1B) of the redistribution structure 10. Therefore, the pitch P3 of the interconnections 62 may be identical to the pitch P2 of the conductive pads 142 as shown in FIG. 1B. In some embodiments, the pitch P3 of the interconnections 62 may be greater than the pitch P1 of the conductive pads 141 as shown in FIG. 1B. The interconnection 62 may be configured to electrically connect the redistribution structure 10 and the electronic component 22. The interconnection 62 may be configured to electrically connect the redistribution structure 10 and the connector 40.

The interconnection 62 may include conductive material(s), such as copper (Cu), tungsten (W), aluminum (Al), ruthenium (Ru), iridium (Ir), nickel (Ni), osmium (Os), rhodium (Rh), molybdenum (Mo), cobalt (Co), alloys thereof, combinations thereof or any metallic materials. The interconnection 62 may enhance the rigidity of the reinforcement 60, which may assist in reducing the warpage of the redistribution structure 10 during manufacturing processes.

In this embodiment, the conductive vias 121, 122, 123, and/or 124 may be tapered toward the reinforcement 60. In this embodiment, the conductive vias 125, 126, and/or 127 may be tapered toward the reinforcement 30.

Figure 3A:
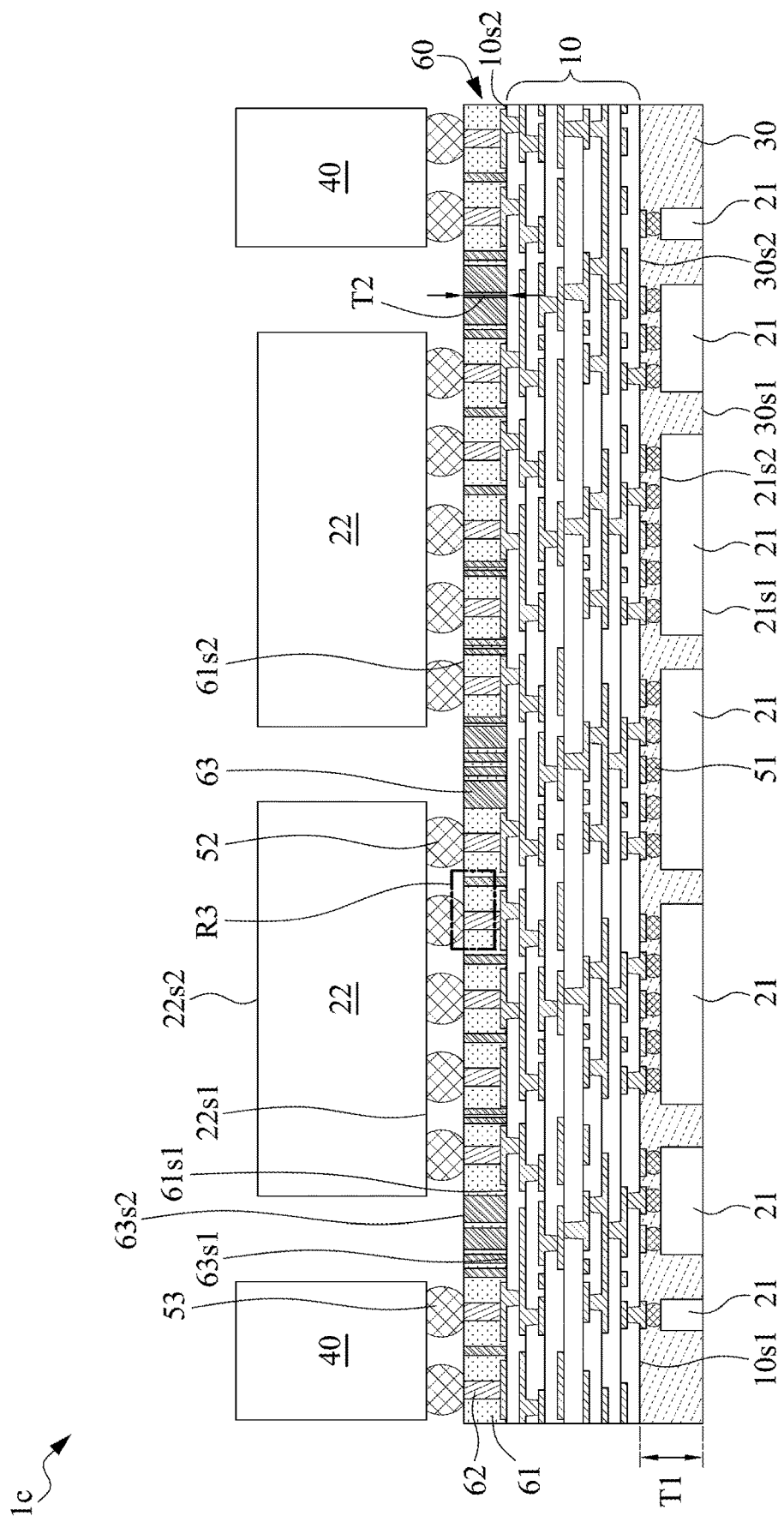
FIG. 3A is a cross-sectional view of an electronic device, in accordance with an embodiment of the present disclosure.

FIG. 3A is a cross-sectional view of an electronic device 1c, in accordance with an embodiment of the present disclosure. The electronic device 1c is similar to the electronic device 1b as shown in FIG. 2, and the differences therebetween are described below.

In some embodiments, the reinforcement 60 may include a plurality of dummy structures 63 (or reinforcement elements or reinforcement). In some embodiments, the dummy structure 63 may be encapsulated by the encapsulant 61. The dummy structure 63 may be disposed within a gap(s) defined by the interconnections 62. In some embodiments, the dummy structures 63 may be arranged irregularly. For example, two abutting dummy structures 63 may have different distances in different areas. In some embodiments, the dummy structure 63 may have different dimensions (e.g., surface area or width or length). In some embodiments, the rigidity (or stiffness) of the dummy structure 63 may be greater than that of the encapsulant 61. In some embodiments, the dummy structure 63 may include semiconductor materials, such as silicon (Si), silicon germanium (SiGe), or other suitable semiconductor materials. In some embodiments, the dummy structure 63 may include a dummy silicon. In some embodiments, the dummy structure 63 may include insulative materials, such as ceramic materials or other suitable insulative materials. In some embodiments, the dummy structure 63 may include conductive materials, such as metal or other suitable conductive materials, and the dummy structure 63 has no electrical connection function. The dummy structure 63 may have a surface 63s1 (or a lower surface) and a surface 63s2 (or an upper surface) opposite to the surface 63s1. The encapsulant 61 may have a surface 61s1 (or a lower surface) and a surface 61s2 (or an upper surface) opposite to the surface 61s1. In some embodiments, the surface 61s1 of the encapsulant 61 may be substantially aligned with the surface 63s1 of the dummy structure 63. In some embodiments, the surface 61s2 of the encapsulant 61 may be substantially aligned with the surface 63s2 of the dummy structure 63. In some embodiments, each of the dummy structures 63 may have a thickness substantially identical to the thickness of the encapsulant 61 (e.g., the thickness T2 of the reinforcement 60). In some embodiments, each of the dummy structures 63 may have a thickness greater than the thickness of the interconnection 62. The dummy structure 63 may enhance the rigidity of the reinforcement 60, which may assist in reducing warpage of the redistribution structure 10 during manufacturing processes.

Figure 3B:
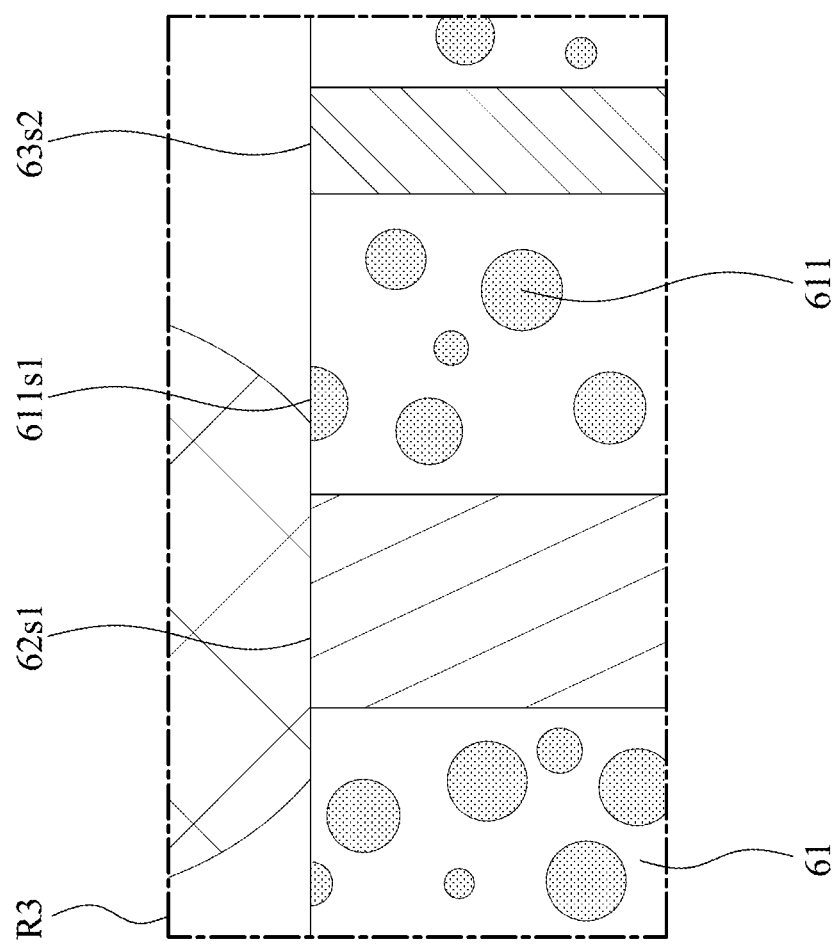
FIG. 3B is a partial enlarged view of the electronic device as shown in FIG. 3A, in accordance with an embodiment of the present disclosure.

FIG. 3B is a partial enlarged view of region R3 of the electronic device 1c as shown in FIG. 3A, in accordance with an embodiment of the present disclosure.

In some embodiments, the encapsulant 61 may include fillers 611. The filler 611 may include, for example, powdered $SiO_2$. In some embodiments, the fillers 611 may include a surface 611s1 (or a truncated surface), which may be formed by performing a grinding technique. In some embodiments, the surface 611s1 of the filler 611 may be substantially aligned or coplanar with a surface 62s1 (or an upper surface) of the interconnection 62. In some embodiments, the surface 611s1 of the filler 611 may be substantially aligned or coplanar with the surface 63s2 of the dummy structure 63.

FIG. 4, FIG. 4A, FIG. 5, FIG. 6, FIG. 7, FIG. 7A, FIG. 8, and FIG. 9 illustrate various stages of an example of manufacturing an electronic device according to some embodiments of the present disclosure.

Figure 4:
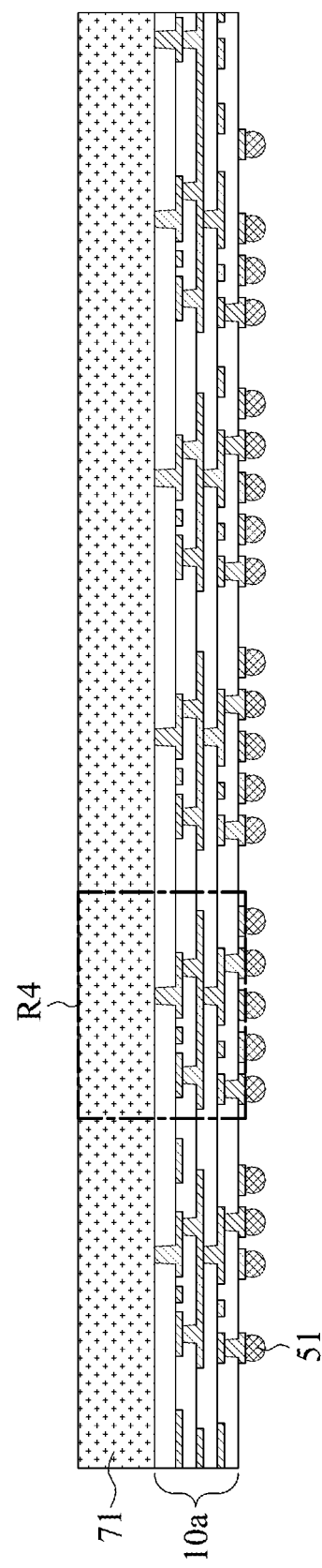
FIG. 4 illustrates one or more stages of an example of a method for manufacturing an electronic device according to some embodiments of the present disclosure.

Referring to FIG. 4, a carrier 71 may be provided. A Portion 10a of a redistribution structure may be formed on or over the carrier 71. Conductive elements 51 may be formed on or over a lower surface (not annotated) of the portion 10a of a redistribution structure. The carrier may abut an upper surface (not annotated) of the portion 10a of a redistribution structure. The carrier 71 may include, for example, a glass or other suitable carriers.

Figure 4A:
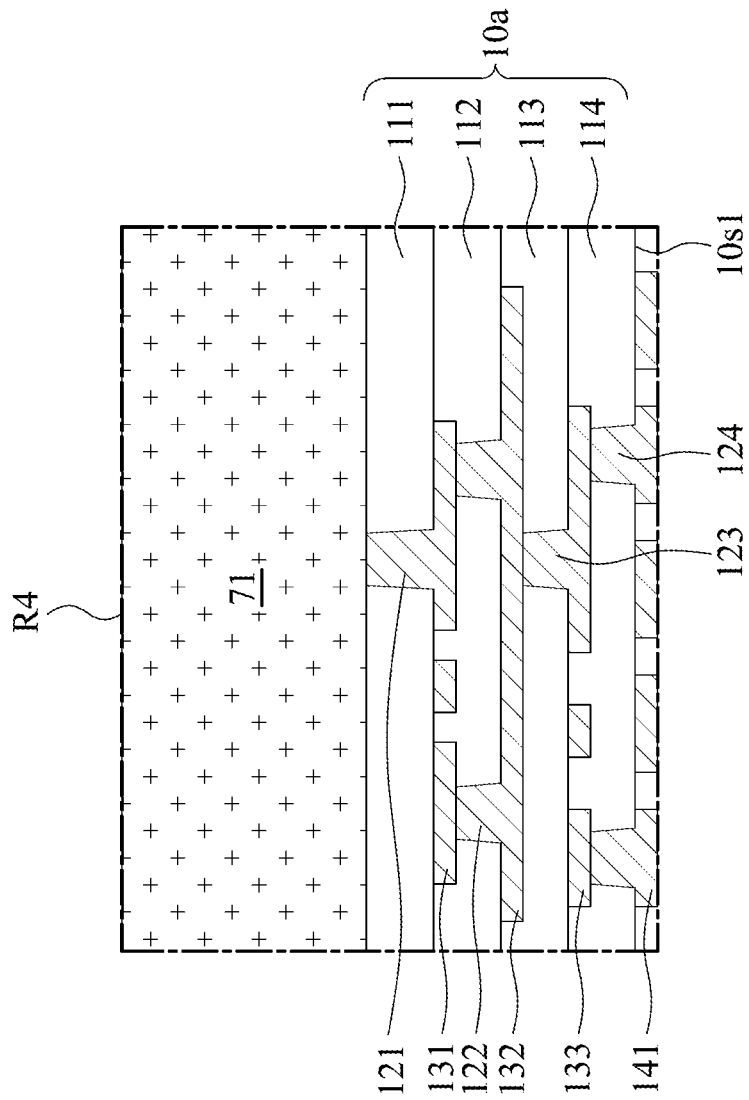
FIG. 4A is a partial enlarged view of the structure as shown in FIG. 4, in accordance with an embodiment of the present disclosure.

FIG. 4A is a partial enlarged view of region R4 as shown in FIG. 4 in accordance with an embodiment of the present disclosure. In some embodiments, dielectric layers 111, 112, 113, and 114 may be formed on or over the carrier 71 in sequence. Conductive vias 121, 122, 123, and 124, conductive layers 131, 132, and 133 as well as conductive pads 141 may be formed on or within the dielectric layer 111, 112, 113, and/or 114. The conductive vias 121, 122, 123, and 124 may be tapered toward the carrier 71. In this stage, four dielectric layers and three conductive layers are formed, which causes a warpage approximating the threshold of entering manufacturing equipment, such as equipment configured to form dielectric layers, equipment configured to perform an etching technique, and/or equipment configured to form seed layers and/or conductive layers.

Figure 5:
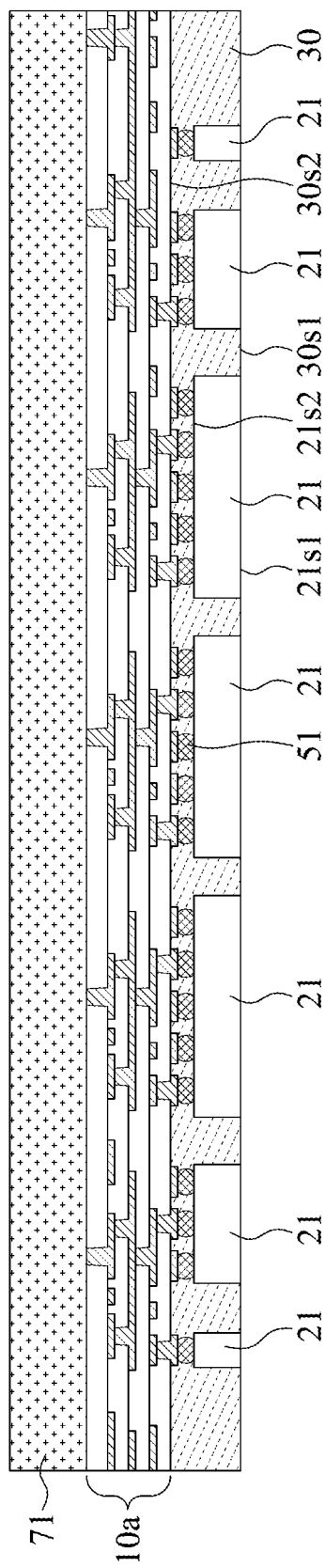
FIG. 5 illustrates one or more stages of an example of a method for manufacturing an electronic device according to some embodiments of the present disclosure.

Referring to FIG. 5, electronic components 21 may be attached to the conductive elements 51. A reinforcement 30 may be formed to encapsulate the electronic components 21. In some embodiments, a grinding technique may be performed to remove a portion of the substrate of the electronic component 21 and the reinforcement 30. As a result, a surface 21s1 of the electronic component 21 may be substantially aligned with a surface 30s1 of the reinforcement 30.

Figure 6:
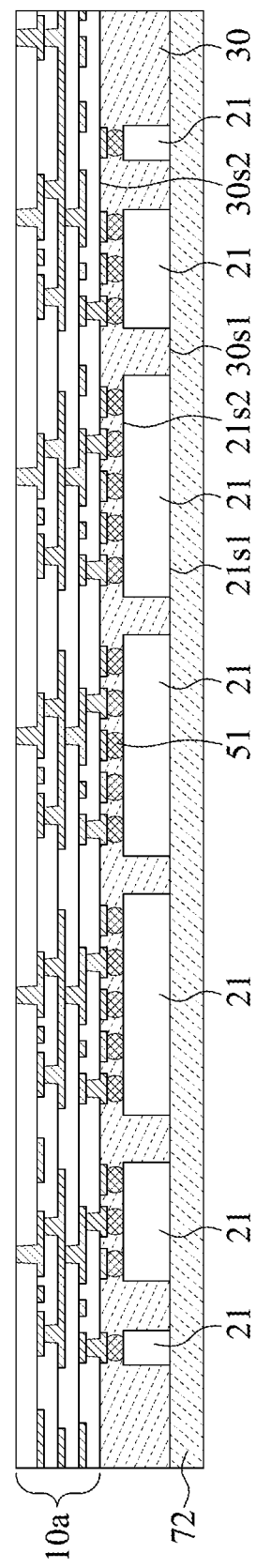
FIG. 6 illustrates one or more stages of an example of a method for manufacturing an electronic device according to some embodiments of the present disclosure.

Referring to FIG. 6, the carrier 71 may be removed from the portion 10a. A carrier 72 may be provided. The reinforcement 30 and the electronic component 21 may be disposed on or over the carrier 72. In some embodiments, the carrier 72 may include a tape or other suitable carriers.

Figure 7:
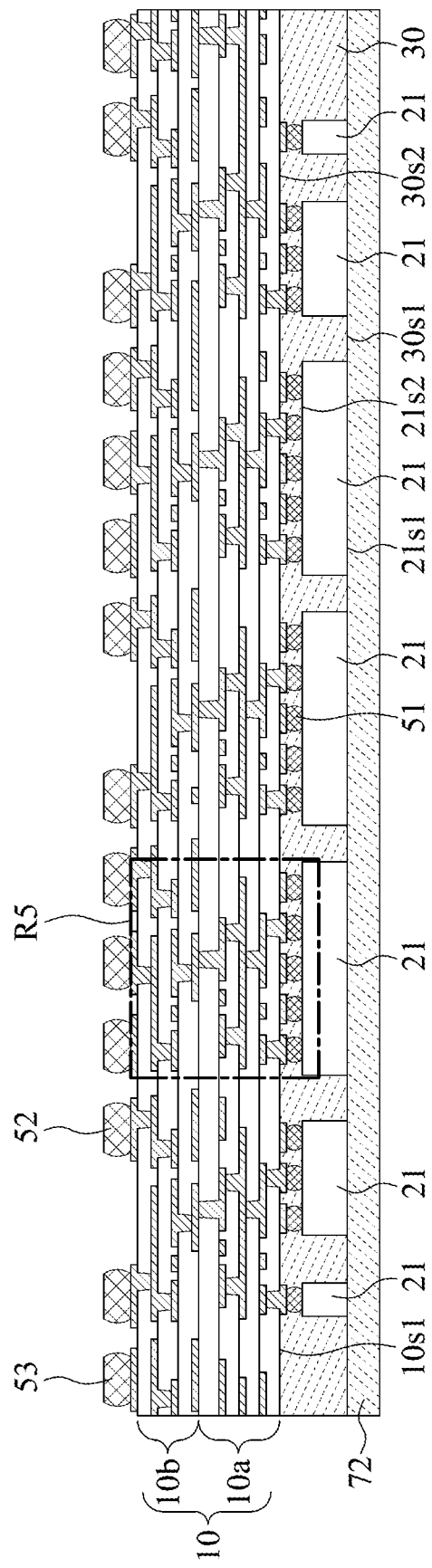
FIG. 7 illustrates one or more stages of an example of a method for manufacturing an electronic device according to some embodiments of the present disclosure.

Referring to FIG. 7, a portion 10b of a redistribution structure may be formed on or over the upper surface of the portion 10a, which thereby produces the redistribution structure 10. Conductive elements 52 and 53 may be formed over the portion 10b of the redistribution structure 10.

Figure 7A:
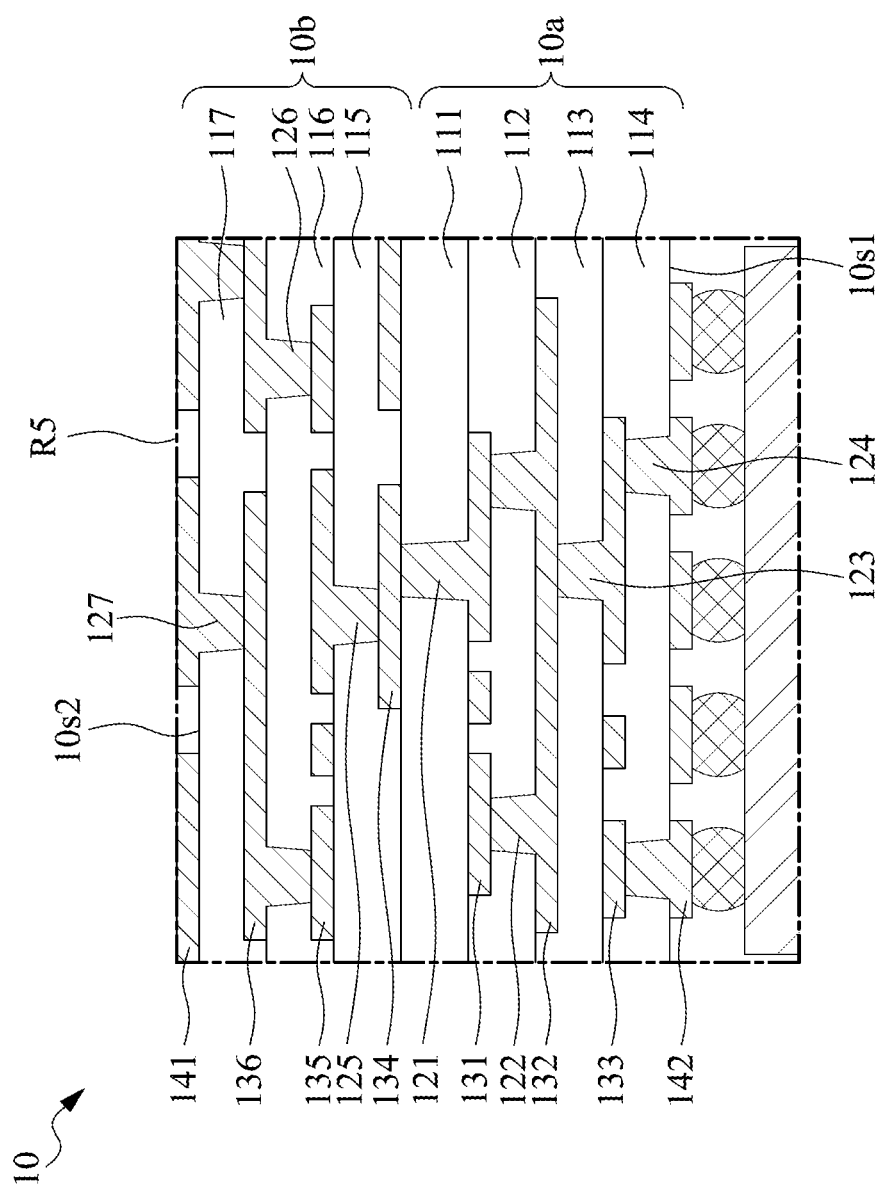
FIG. 7A is a partial enlarged view of the structure as shown in FIG. 7, in accordance with an embodiment of the present disclosure.

FIG. 7A is a partial enlarged view of region R5 as shown in FIG. 7 in accordance with an embodiment of the present disclosure. In some embodiments, dielectric layers 115, 116, and 117 may be formed on or over the dielectric layer 111 in sequence. Conductive vias 125, 126, and 127, conductive layers 134, 135, and 136 as well as conductive pads 142 may be formed on or within the dielectric layers 115, 116, and/or 117. The conductive vias 125, 126, and 127 may be tapered toward the surface 10s1 of the redistribution structure 10. In this stage, the reinforcement 30 may reduce the warpage caused by the portion 10a of the redistribution structure 10. Further, the reversed profiles of the conductive vias 125, 126, and 127 may neutralize the warpage caused by the conductive vias 121, 122, 123, and 124. Thus, the redistribution structure 10 with six or more dielectric layers and/or conductive layers may be produced. In some embodiments, the number of the layers (e.g., dielectric layers, and/or conductive layers) of the portion 10a may be different from those of the portion 10b. In some embodiments, each of the portions 10a and 10 may be regarded as a redistribution structure.

Figure 8:
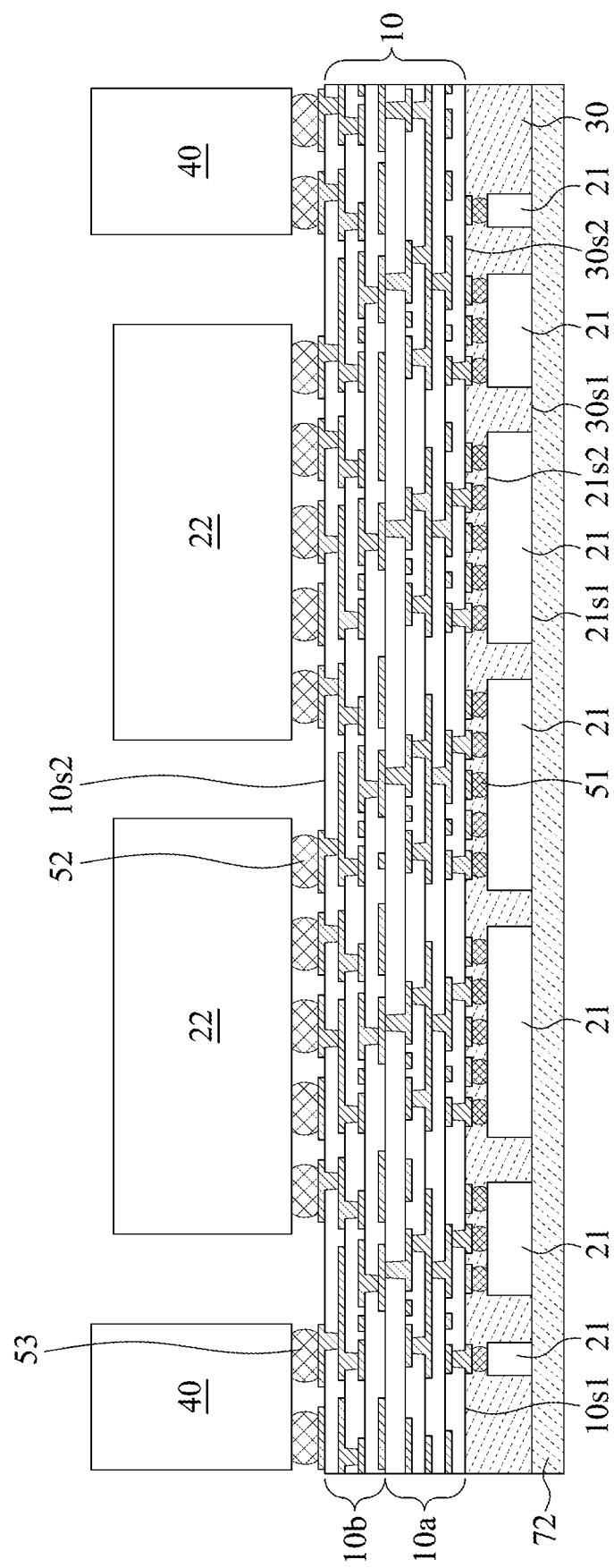
FIG. 8 illustrates one or more stages of an example of a method for manufacturing an electronic device according to some embodiments of the present disclosure.

Referring to FIG. 8, electronic components 22 and connectors 40 may be formed over the conductive elements 52 and 53, respectively.

Figure 9:
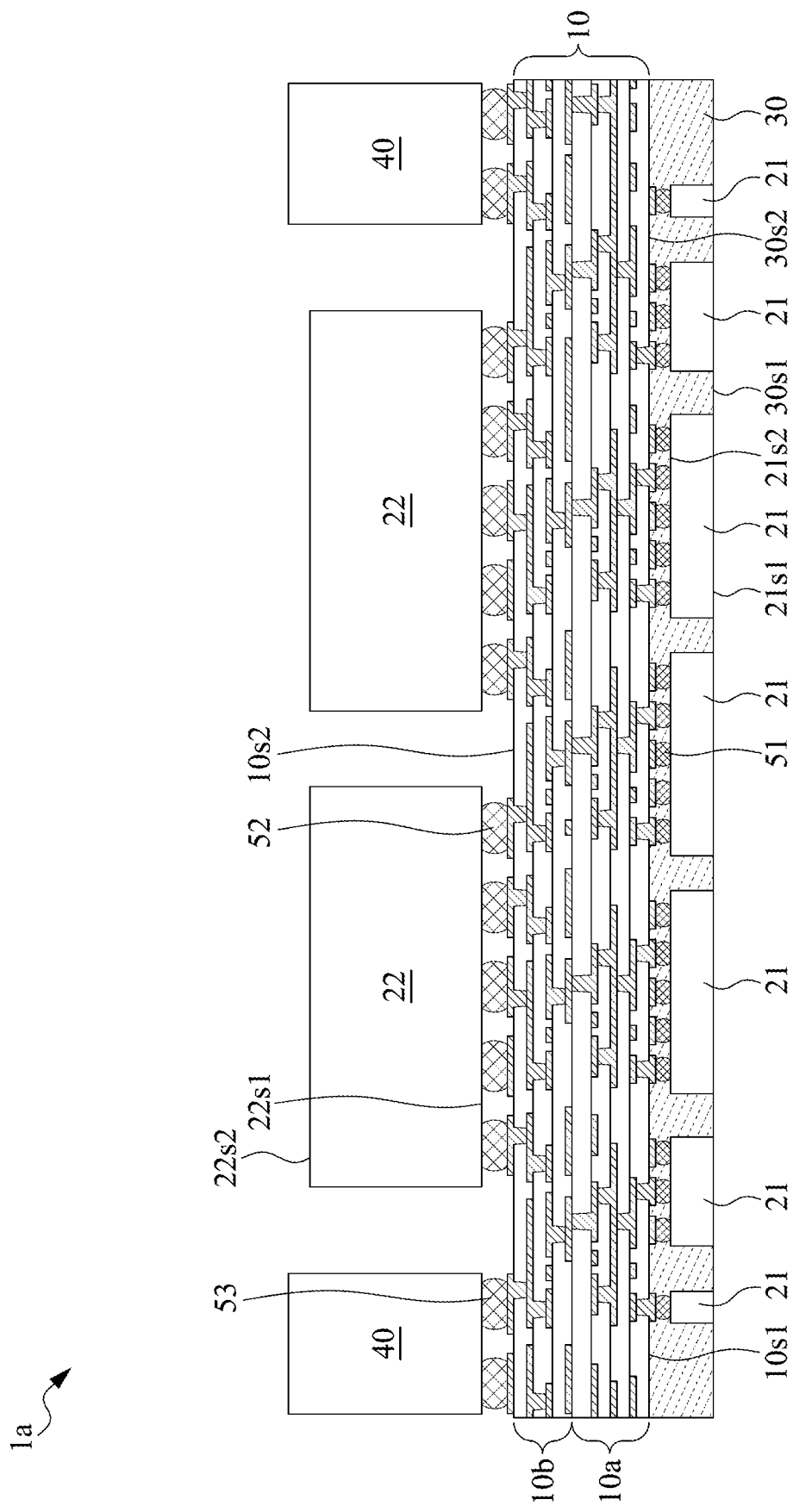
FIG. 9 illustrates one or more stages of an example of a method for manufacturing an electronic device according to some embodiments of the present disclosure.

Referring to FIG. 9, the carrier 72 may be removed from the reinforcement 30. Thus, an electronic device, such as the electronic device 1a as shown in FIG. 1A, may be produced.

FIG. 10, FIG. 11, FIG. 12, and FIG. 13 illustrate various stages of manufacturing an electronic device according to some embodiments of the present disclosure.

Figure 10:
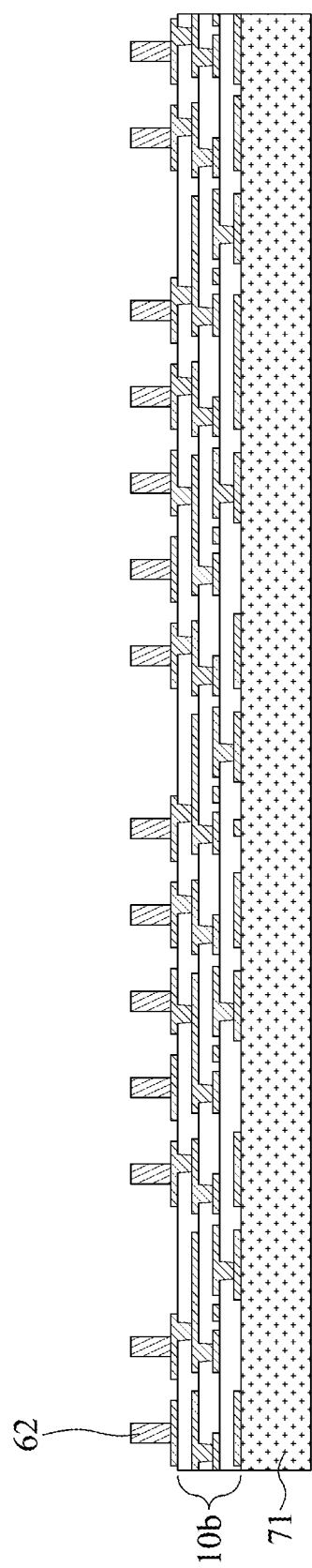
FIG. 10 illustrates one or more stages of an example of a method for manufacturing an electronic device according to some embodiments of the present disclosure.

Referring to FIG. 10, a portion 10b of a redistribution structure may be formed on or over the carrier 71. For example, dielectric layers 115, 116, and 117, as shown in FIG. 1B, may be formed on or over the carrier 71 in sequence. Conductive vias 125, 126, and 127, conductive layers 134, 135, and 136 as well as conductive pads 142 as shown in FIG. 1B may be formed on or within the dielectric layer 115, 116, and/or 117. Interconnections 62 may be formed over the portion 10b of a redistribution structure. In this stage, three dielectric layers and three conductive layers are formed, which causes a warpage approximating the threshold of entering manufacturing equipment.

Figure 11:
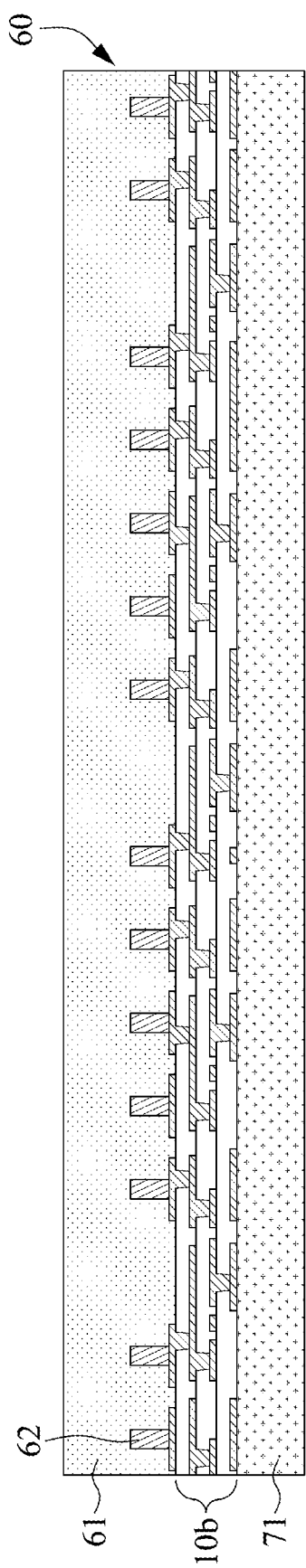
FIG. 11 illustrates one or more stages of an example of a method for manufacturing an electronic device according to some embodiments of the present disclosure.

Referring to FIG. 11, an encapsulant 61 may be formed to cover the portion 10b and the interconnection 62, which thereby produces a reinforcement 60.

Figure 12:
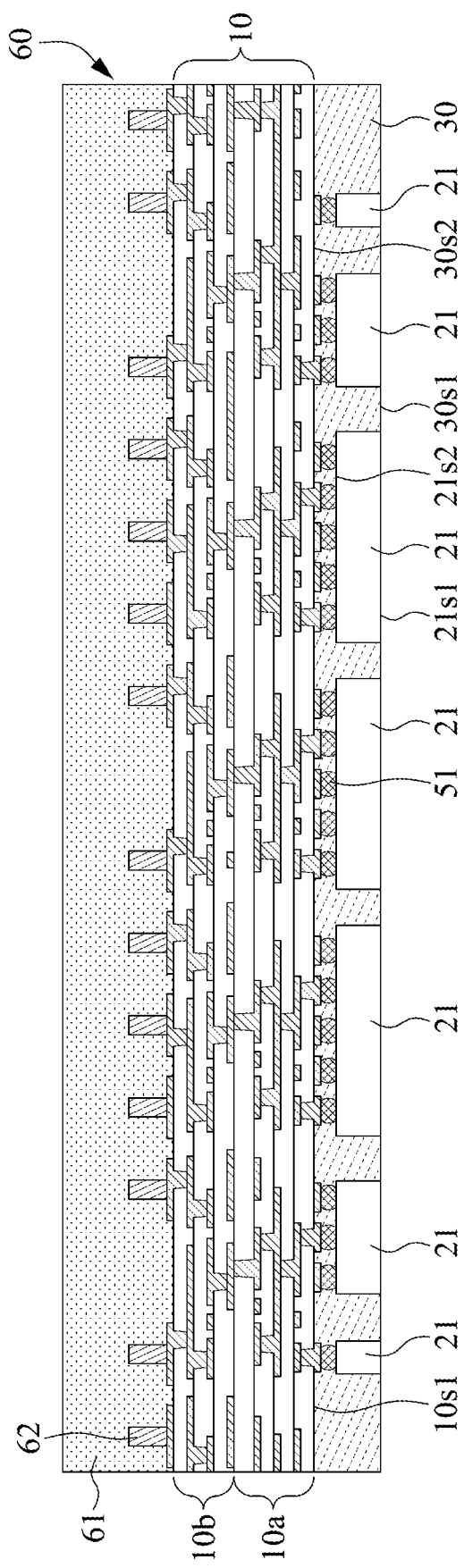
FIG. 12 illustrates one or more stages of an example of a method for manufacturing an electronic device according to some embodiments of the present disclosure.

Referring to FIG. 12, the portion 10a may be formed over the portion 10b, which thereby produces the redistribution structure 10. The electronic components 21 and the reinforcement 30 may be formed on or over the portion 10a of the redistribution structure 10. In this stage, the reinforcement 60 may serve as a carrier and reduce the warpage caused by the portion 10b of the redistribution structure 10. Further, the reversed profiles of the conductive vias in the portion 10a may neutralize the warpage caused by the conductive vias in the portion 10b. Thus, the redistribution structure 10 with six or more dielectric layers and/or conductive layers may be produced.

Figure 13:
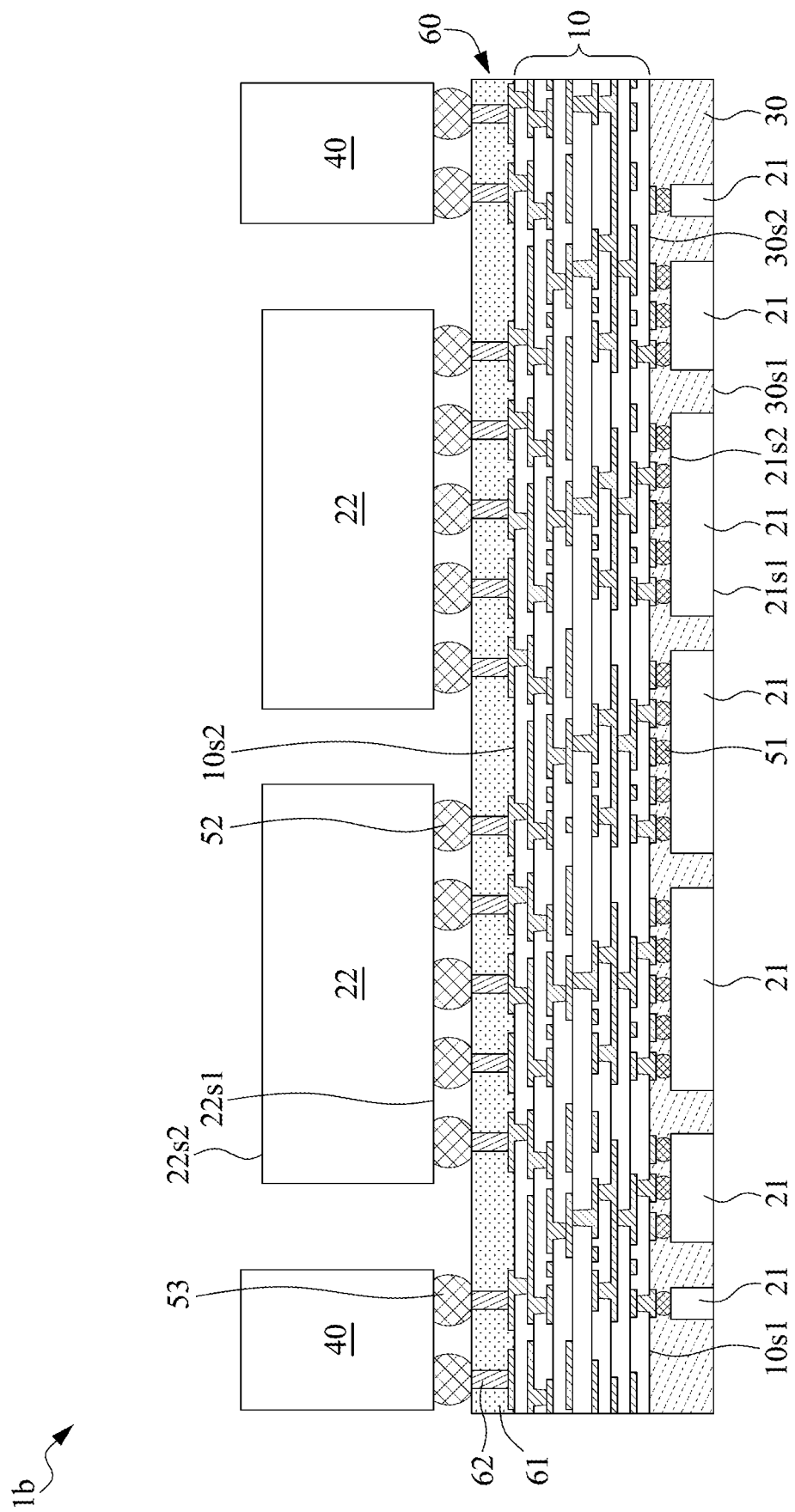
FIG. 13 illustrates one or more stages of an example of a method for manufacturing an electronic device according to some embodiments of the present disclosure.

Referring to FIG. 13, a grinding technique may be performed to remove a portion of the encapsulant 61. The electronic components 22 and the connectors 40 may be formed over the reinforcement 60. Thus, an electronic device, such as the electronic device 1b as shown in FIG. 2, may be produced.

Figure 14:
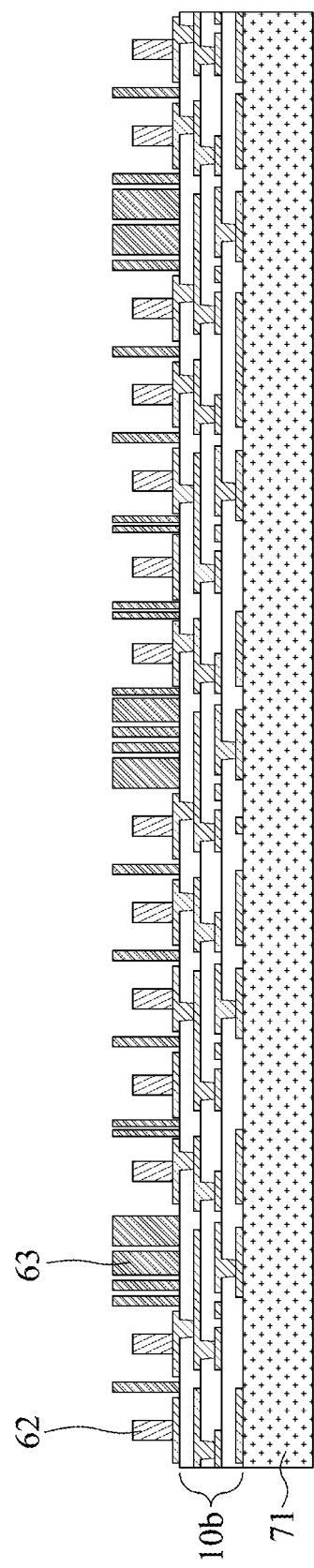
FIG. 14 illustrates one or more stages of an example of a method for manufacturing an electronic device according to some embodiments of the present disclosure.
Figure 15:
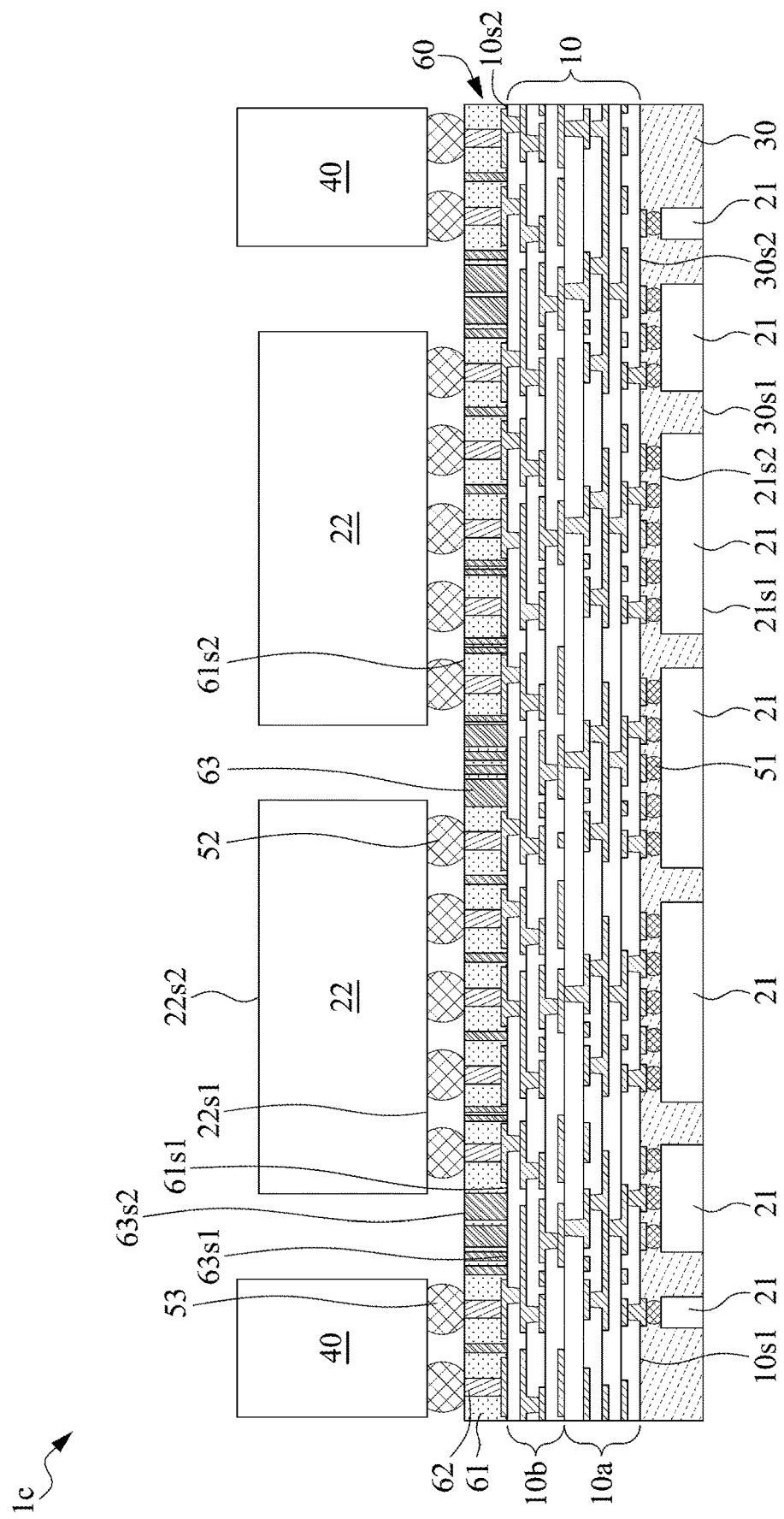
FIG. 15 illustrates one or more stages of an example of a method for manufacturing an electronic device according to some embodiments of the present disclosure.

FIG. 14 and FIG. 15 illustrate various stages of manufacturing an electronic device according to some embodiments of the present disclosure.

Referring to FIG. 14, a portion 10b of a redistribution structure may be formed on or over the carrier 71. The interconnections 62 may be formed over the portion 10b of a redistribution structure. In some embodiments, dummy structures 63 may be formed over the portion 10b of a redistribution structure. The dummy structure 63 may be disposed within a gap(s) defined by the interconnections 62.

Referring to FIG. 15, an encapsulant 61 may be formed over the portion 10b of a redistribution structure, which thereby produces the reinforcement 60. A grinding technique may be performed to remove a portion of the encapsulant 61 and the dummy structure 63 so that a surface 63s2 of the dummy structure 63 may be aligned with a surface 61s2 of the encapsulant 61. The electronic components 22 and the connectors 40 may be formed on or over the reinforcement 60. The portion 10a of a redistribution structure, the electronic components 21 and the reinforcement 30 may be formed. Thus, an electronic device, such as the electronic device 1c as shown in FIG. 3A, may be produced. In some embodiments, not all of the encapsulant 61 over the dummy structure 63 is removed before and/or after performing a grinding technique which is configured to remove, for example, the reinforcement 30. Before performing a grinding technique, the intermediate structure may still have a small warpage, which may cause that a portion of the redistribution layer is removed, and thus make a failure of electrical connection. Therefore, a portion of the encapsulant 61 may remain so that the encapsulant 61 and the reinforcement 30 can collectively reduce the warpage of the intermediate structure. In some embodiments, the dummy structure 63 may be disposed between the electronic component 22 and the redistribution structure 10. A portion of the dummy structure 63 is disposed over the redistribution structure 10 and not covered by the electronic component 22. In some embodiments, the width of the dummy structure 63 not covered by the electronic component 22 is greater than the width of the dummy structure 63 covered by the electronic component 22.

Figure 16:
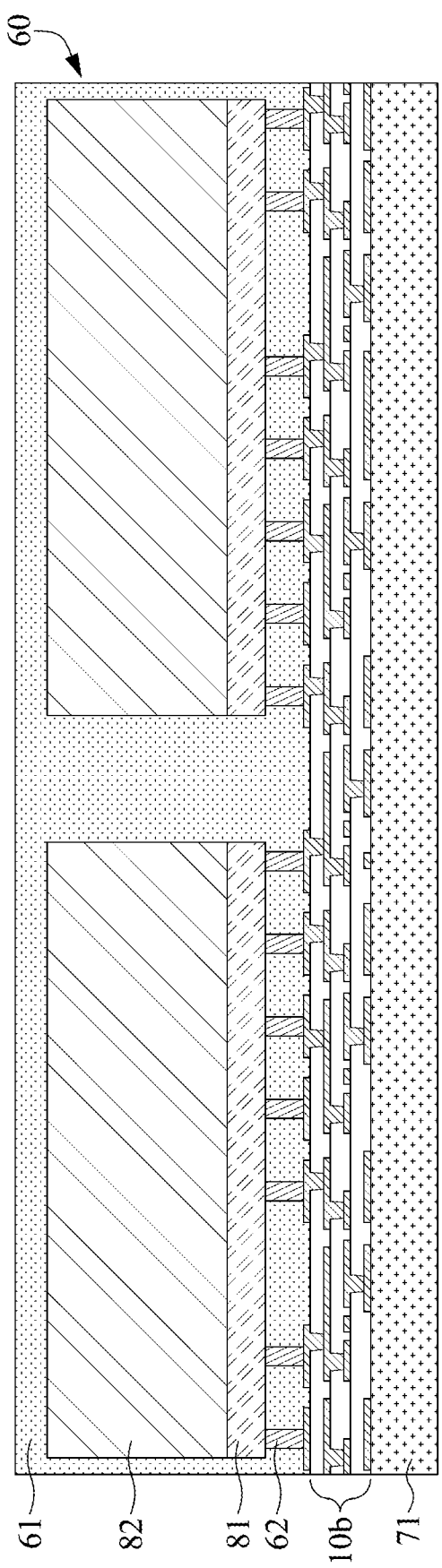
FIG. 16 illustrates one or more stages of an example of a method for manufacturing an electronic device according to some embodiments of the present disclosure.

FIG. 16, FIG. 16A, FIG. 16B, FIG. 17, FIG. 17A, FIG. 17B, FIG. 18, and FIG. 19 illustrate various stages of an example of manufacturing an electronic device according to some embodiments of the present disclosure. The initial stage of the illustrated process is the same as, or similar to, the stage illustrated in FIG. 10. FIG. 16 depicts a stage subsequent to that depicted in FIG. 10.

Referring to FIG. 16, adhesive elements 81 and dummy elements 82 may be formed over the interconnection 62, and the encapsulant 61 may be formed to encapsulate the adhesive elements 81 and the dummy elements 82. The adhesive element 81 may be configured to attach the dummy element 82 to the interconnection 62. The dummy element 82 may be disposed on or over the adhesive element 81. The dummy element 82 may be configured to enhance the rigidity (or stiffness) of the reinforcement 60. The dummy element 82 may include, for example, a dummy die (e.g., a silicon dummy die) without active components and/or passive components formed therein. In some embodiments, one dummy element 82 may cover all the entire wafer which includes all electronic device before singulation, which may simplify the manufacturing processes in comparison with the structure including multiple dummy elements 82.

Figure 16A:
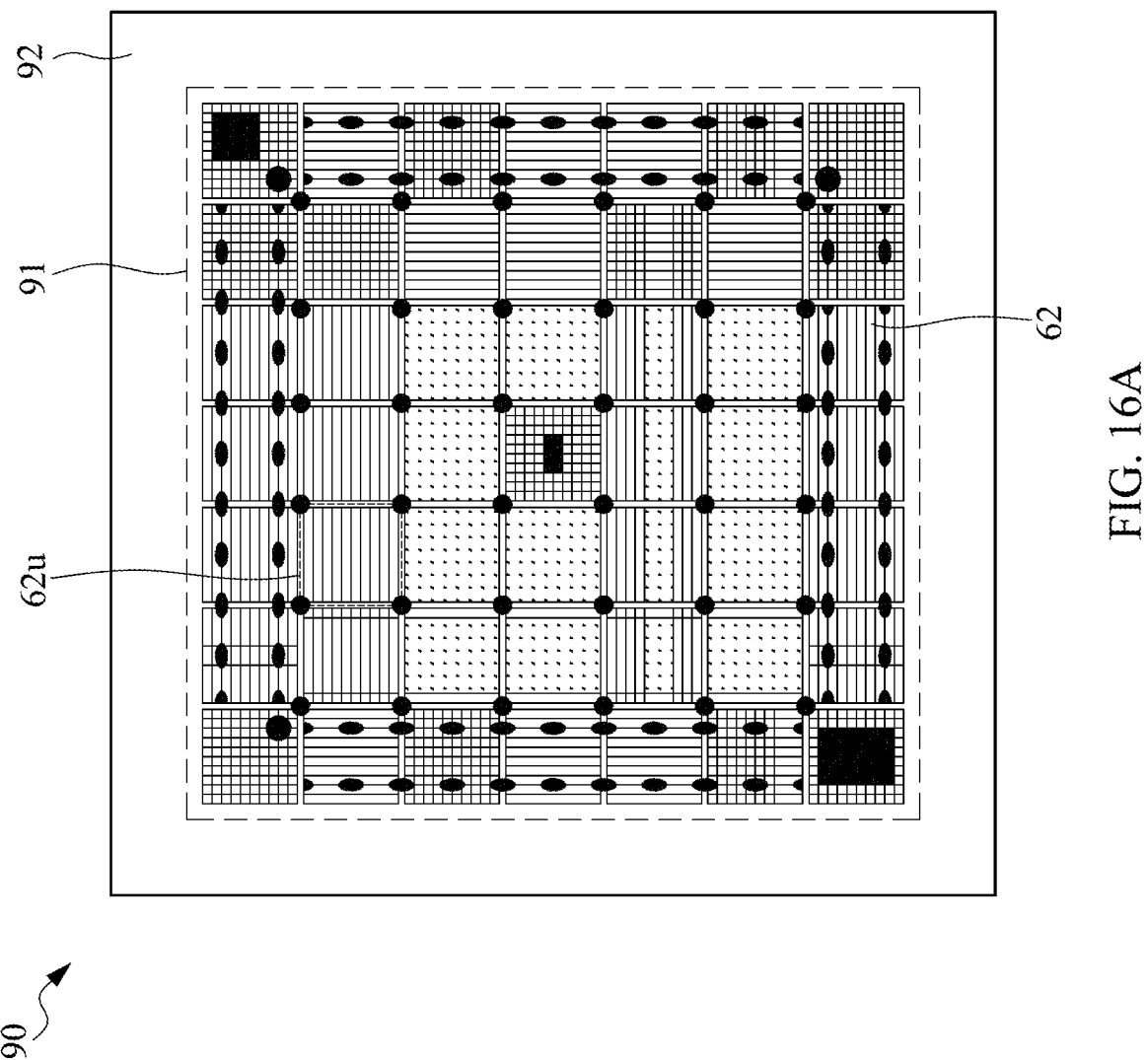
FIG. 16A is a top view of a layout of interconnections as shown in FIG. 16, in accordance with an embodiment of the present disclosure.

As shown in FIG. 16A, a wafer 90 (or a portion of a wafer) may include, for example, a plurality of units, each of which may correspond to an electronic device after singulation. The wafer 90 may include a plurality of interconnection arrays 62u. Each of the interconnection arrays 62u may include a plurality of interconnections 62 with different profiles and/or dimensions. The gray area shown in FIG. 16A may correspond to a region on which no interconnections 62 are disposed. The wafer 90 may have an active region 91 and a peripheral region 92 surrounding the active region 91. The interconnection array 62u may be formed within the active region 91.

Figure 16B:
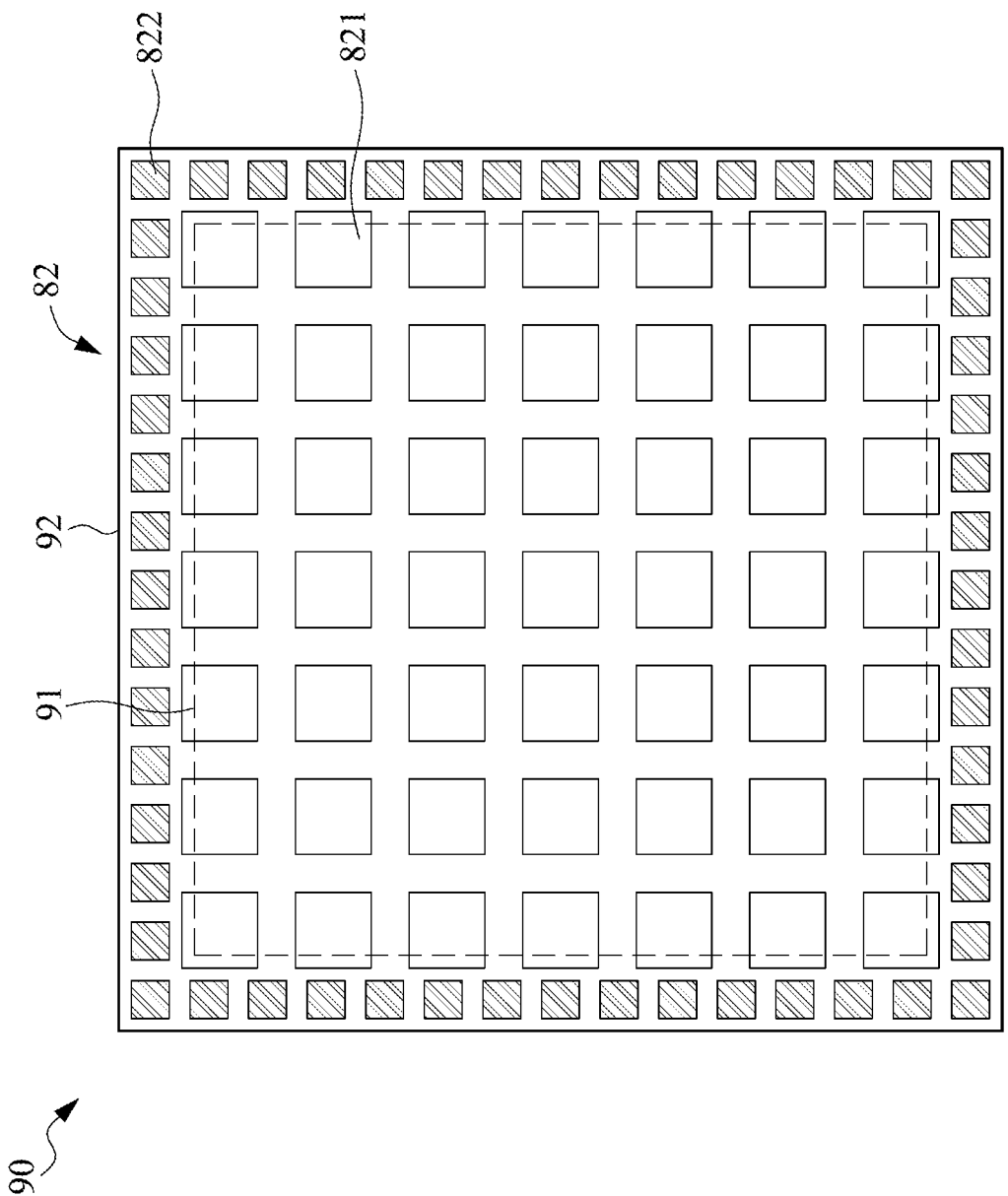
FIG. 16B is a top view of a layout of dummy dies as shown in FIG. 16, in accordance with an embodiment of the present disclosure.

As shown in FIG. 16B, the dummy element 82 may include a plurality of segments 821 and a plurality of segments 822. Each of the segments 821 may have a dimension (e.g., surface area) greater than that the segment 822. In some embodiments, the segment 821 may be formed within the active region 91. In some embodiments, a portion of the segments 821 may exceed the boundary between the active region 91 and the peripheral region 92. In some embodiments, the segments 822 may be disposed within the peripheral region 92. As shown in FIG. 16B and FIG. 16C, the segment 821 may overlap the interconnection 62 from a top view. As shown in FIG. 16B and FIG. 16C, the segment 822 may be free from overlapping the interconnection 62 from a top view.

Figure 17:
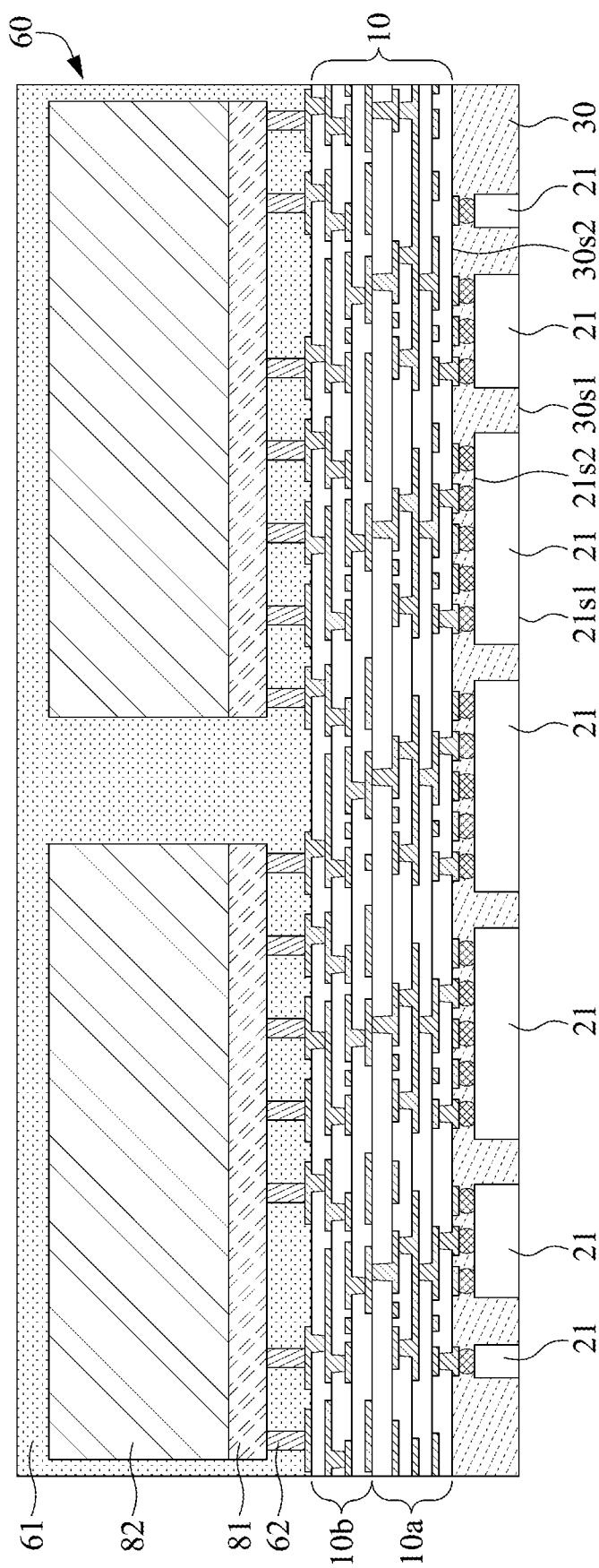
FIG. 17 illustrates one or more stages of an example of a method for manufacturing an electronic device according to some embodiments of the present disclosure.

Referring to FIG. 17, the portion 10a of a redistribution structure may be formed over the portion 10b, which thereby produces the redistribution structure 10. The electronic components 21 and the reinforcement 30 may be formed over the portion 10a of the redistribution structure 10.

Figure 17A:
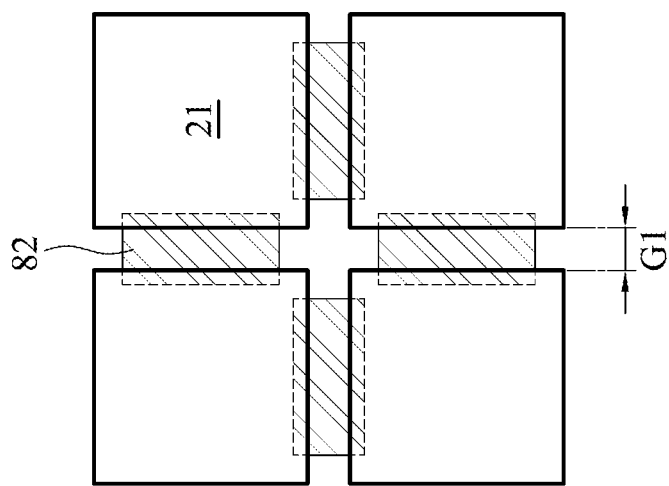
FIG. 17A is a top view of a layout of dummy dies and electronic components as shown in FIG. 17, in accordance with an embodiment of the present disclosure.

As shown in FIG. 17A, the dummy element 82 may overlap a gap G1 defined by the electronic components 21. In some embodiments, the dummy element 82 may overlap a portion of the electronic component 21. It should be noted that although FIG. 17A illustrates that each of the electronic components 21 has the same dimension, the electronic components 21 may have different dimensions in other embodiments. In some embodiments, the dummy element 82 may overlap two adjacent electronic components 21.

Figure 17B:
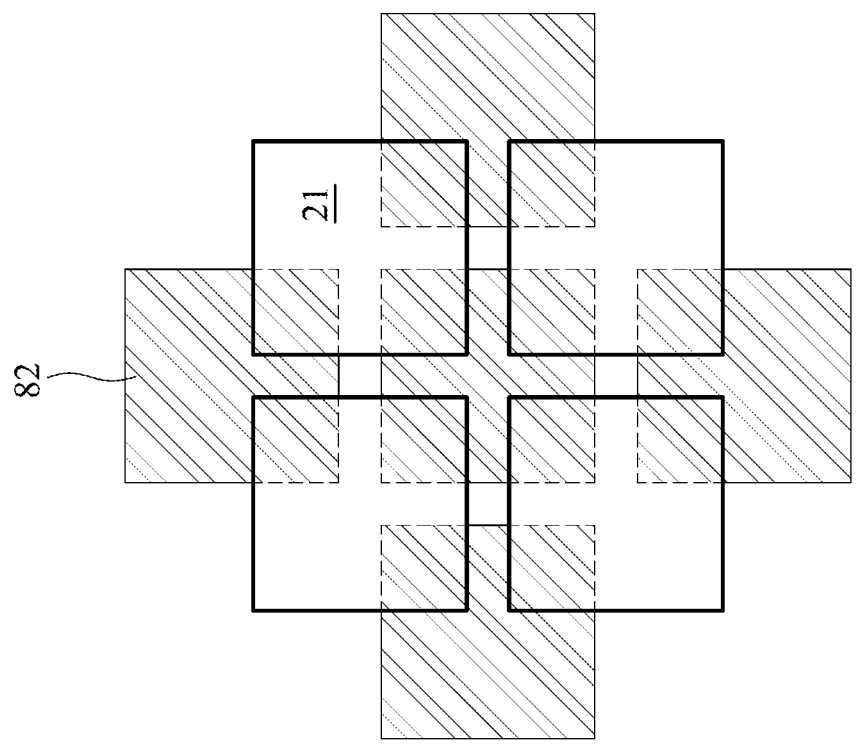
FIG. 17B is a top view of a layout of dummy dies and electronic components as shown in FIG. 17, in accordance with another embodiment of the present disclosure.

As show in FIG. 17B, the dummy element 82 may overlap four corners of four respective electronic components 21. In some embodiments, the gap defined by four electronic components 21 may overlap one of the dummy elements 82 from a top view.

Figure 18:
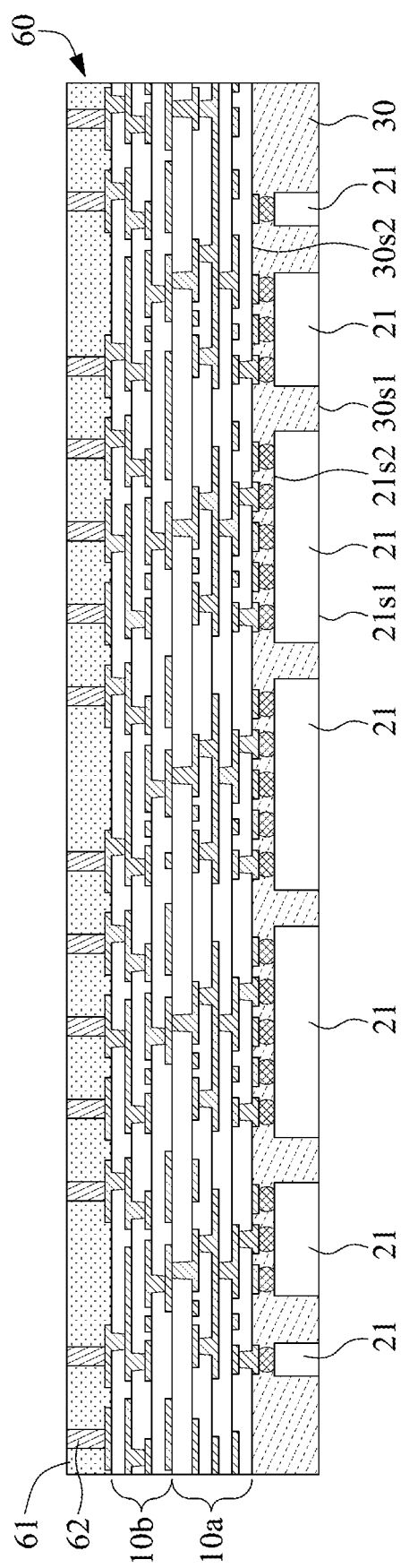
FIG. 18 illustrates one or more stages of an example of a method for manufacturing an electronic device according to some embodiments of the present disclosure.

Referring to FIG. 18, the dummy elements 82 may be removed. The adhesive elements 81 may be removed. In some embodiments, a grinding technique may be performed to remove the adhesive elements 81, the dummy elements 82, and a portion of the encapsulant 61. The interconnection 62 may be exposed by the encapsulant 61 after the grinding technique is performed.

Figure 19:
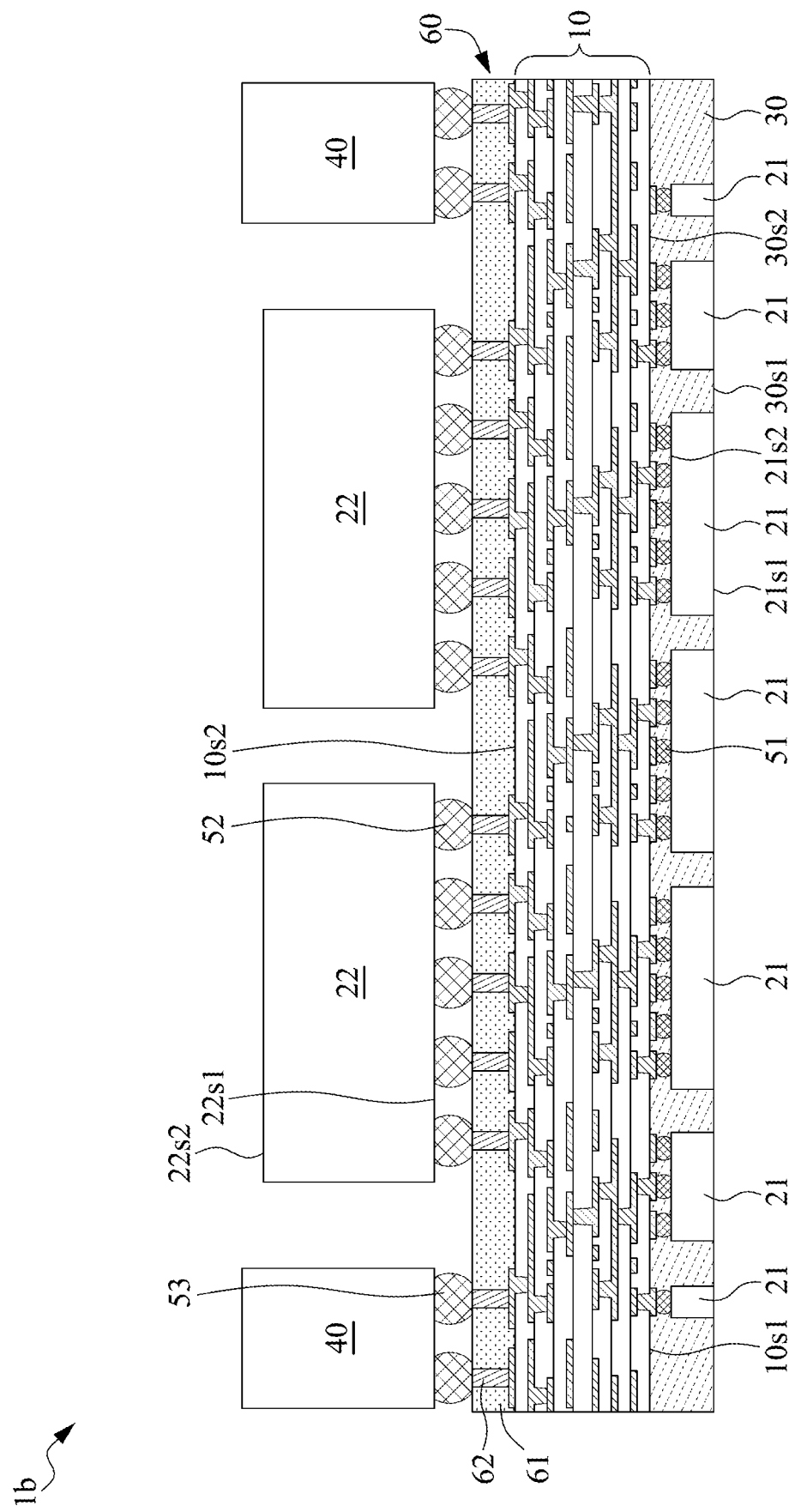
FIG. 19 illustrates one or more stages of an example of a method for manufacturing an electronic device according to some embodiments of the present disclosure.

Referring to FIG. 19, the conductive elements 52 and 53 may be formed over the reinforcement 60. The electronic components 22 and the connectors 40 may be formed over the conductive elements 52 and 53, respectively. Thus, an electronic device, such as the electronic device 1b as shown in FIG. 2, may be produced.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 µm, no greater than 2 µm, no greater than 1 µm, or no greater than 0.5 µm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having conductivity greater than approximately 104 S/m, such as at least 105 S/m or at least 106 S/m. The electrical conductivity of a material can sometimes vary with temperature. Unless otherwise specified, the electrical conductivity of a material is measured at room temperature.

As used herein, the term "active surface" may refer to a surface on which an active circuit or an active circuit region is disposed, or refer to a surface from which a signal is transmitted and/or received.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An electronic device, comprising:
   a first redistribution structure;
   a first encapsulant supporting the first redistribution structure and configured to function as a first reinforcement to provide a second redistribution structure having a plurality of conductive layers disposed over the first redistribution structure; and
   a second reinforcement disposed over the second redistribution structure,
   wherein the second reinforcement has a lateral surface substantially aligned with a lateral surface of the second redistribution structure.

2. The electronic device of claim 1, wherein the first redistribution structure comprises a first conductive via tapered toward the second redistribution structure,
   and wherein the second redistribution structure comprises a second conductive via tapered toward the first redistribution structure.

3. The electronic device of claim 2, wherein a first one of the plurality of conductive layers of the second redistribution structure connected to the first conductive via and the second conductive via.

4. The electronic device of claim 1, further comprising:
   a first electronic component disposed under the first redistribution structure and encapsulated by the first encapsulant.

5. The electronic device of claim 4, further comprising:
   a second electronic component disposed over the second redistribution structure.

6. The electronic device of claim 4, wherein a portion of the first electronic component is exposed from the first encapsulant.

7. The electronic device of claim 4, wherein a width of the second reinforcement is substantially the same as a width of the second redistribution structure.

8. The electronic device of claim 7, further comprising:
   a second electronic component disposed over the second redistribution structure; and
   a solder element vertically disposed between the second electronic component and the second reinforcement, wherein the solder element is free from laterally overlapping the second reinforcement.

9. The electronic device of claim 8, further comprising:
   a dummy die disposed within the second reinforcement, wherein the dummy die has no electrical function.

10. The electronic device of claim 7, further comprising:
    an interconnection at least partially disposed within the second reinforcement, wherein the interconnection is electrically connected to the first electronic component through the second redistribution structure and the first redistribution structure.

11. The electronic device of claim 9, wherein an upper surface of the dummy die is substantially aligned with an upper surface of the second reinforcement.

12. The electronic device of claim 9, wherein a thickness of the dummy die is substantially equal to a thickness of the second reinforcement.

13. An electronic device, comprising:
    a redistribution structure;
    a first electronic component disposed over the redistribution structure;
    a first reinforcement disposed under the redistribution structure;
    a second reinforcement disposed between the redistribution structure and the first electronic component; and
    a dummy die disposed within the second reinforcement, wherein the dummy die comprises a semiconductor material and has no electrical function.

14. The electronic device of claim 13, further comprising:
    a plurality of second electronic components encapsulated by the first reinforcement,
    wherein the second reinforcement comprises a plurality of portions separated from each other, and at least one of the plurality of portions of the second reinforcement overlaps a gap between two adjacent second electronic components from a top view.

15. The electronic device of claim 14, wherein an upper surface, facing the plurality of the second electronic components, of the dummy die is exposed by the second reinforcement.

16. The electronic device of claim 13, further comprising:
an interconnection encapsulated by the second reinforcement and configured to electrically connect the first electronic component with the redistribution structure, wherein an upper surface of the interconnection and an upper surface of the dummy die are substantially level.

17. A method of manufacturing an electronic device, comprising:
providing a structure comprising a first redistribution structure and a first reinforcement under the first redistribution structure;
forming a second redistribution structure over the first redistribution structure;
disposing a dummy die over the second redistribution structure, wherein the dummy die has no electrical function;
forming a second reinforcement over the second redistribution structure and encapsulating the dummy die;
grinding the dummy die and the second reinforcement; and
disposing a first electronic component over the second redistribution structure.

18. The method of claim 17, wherein an upper surface of the second reinforcement is substantially aligned with an upper surface of the dummy die after grinding the dummy die and the second reinforcement.

19. The method of claim 17, wherein the first electronic component is disposed after the second reinforcement is formed.

20. The method of claim 17, wherein the dummy die comprises a semiconductor material.

* * * * *